(12) United States Patent
Yun

(10) Patent No.: US 9,349,471 B2
(45) Date of Patent: May 24, 2016

(54) NONVOLATILE MEMORY DEVICE, STORAGE DEVICE HAVING THE SAME, AND OPERATION AND READ METHODS THEREOF

(71) Applicant: SAMSUNG ELECTRONICS CO., LTD., Suwon-Si, Gyeonggi-Do (KR)

(72) Inventor: Sung-Won Yun, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/670,879

(22) Filed: Mar. 27, 2015

(65) Prior Publication Data
US 2015/0318045 A1    Nov. 5, 2015

(30) Foreign Application Priority Data

Apr. 30, 2014   (KR) .................. 10-2014-0052578

(51) Int. Cl.
| | |
|---|---|
| G11C 11/34 | (2006.01) |
| G11C 16/26 | (2006.01) |
| G11C 16/04 | (2006.01) |
| G11C 16/24 | (2006.01) |

(52) U.S. Cl.
CPC ............ G11C 16/26 (2013.01); G11C 16/0483 (2013.01); G11C 16/24 (2013.01)

(58) Field of Classification Search
CPC ..... G11C 16/26; G11C 16/24; G11C 16/0483
USPC .............. 365/185.05, 185.17, 185.18, 185.25
See application file for complete search history.

(56) References Cited

U.S. PATENT DOCUMENTS

| | | | |
|---|---|---|---|
| 7,453,750 | B2 | 11/2008 | Kim |
| 7,495,956 | B2 | 2/2009 | Fong et al. |
| 7,495,992 | B2 | 2/2009 | Pan |
| 7,512,011 | B2 | 3/2009 | Park |
| 7,679,133 | B2 | 3/2010 | Son et al. |
| 7,852,676 | B2 | 12/2010 | Maejima |
| 7,864,581 | B2 | 1/2011 | Lee |
| 7,898,872 | B2 | 3/2011 | Han |
| 8,199,567 | B2 | 6/2012 | Chang-Wook et al. |
| 8,427,873 | B2 | 4/2013 | Mokhlesi |
| 8,488,384 | B2 | 7/2013 | Kim |
| 8,553,466 | B2 | 10/2013 | Han et al. |
| 8,559,235 | B2 | 10/2013 | Yoon et al. |
| 8,654,587 | B2 | 2/2014 | Yoon et al. |
| 2006/0146612 | A1 | 7/2006 | Lim et al. |
| 2009/0052257 | A1* | 2/2009 | Park et al. ................. 365/185.23 |
| 2010/0054036 | A1* | 3/2010 | Lee et al. .................. 365/185.03 |
| 2011/0233648 | A1 | 9/2011 | Seol et al. |
| 2012/0170380 | A1* | 7/2012 | Kumazaki et al. ........ 365/185.25 |
| 2014/0003149 | A1* | 1/2014 | Maejima ................... 365/185.17 |
| 2015/0003169 | A1 | 1/2015 | Nam et al. |

FOREIGN PATENT DOCUMENTS

| | | |
|---|---|---|
| KR | 1020080030214 A | 4/2008 |
| KR | 1020150001400 A | 1/2015 |

* cited by examiner

*Primary Examiner* — Pho M Luu
*Assistant Examiner* — Mohammed A Bashar
(74) *Attorney, Agent, or Firm* — Volentine & Whitt, PLLC

(57) ABSTRACT

A method is for operating a nonvolatile memory device, the nonvolatile memory device including at least one string connected to a bit line, the at least one string including a plurality of memory cells connected in series, each of the plurality of memory cells being connected to a respective word line among a plurality of word lines and stacked in a direction perpendicular to a substrate. The method includes applying a word line voltage needed for an operation to a first word line among the word lines, applying a recovery voltage higher than a ground voltage to the first word line after the operation, and then floating the first word line.

29 Claims, 23 Drawing Sheets

NONVOLATILE MEMORY DEVICE, STORAGE DEVICE HAVING THE SAME, AND OPERATION AND READ METHODS THEREOF

CROSS-REFERENCE TO RELATED APPLICATIONS

This application claims priority under 35 U.S.C. §119 from Korean Patent Application No. 10-2014-0052578 filed Apr. 30, 2014, the entire contents of which are hereby incorporated by reference.

BACKGROUND

The inventive concepts described herein relate to a nonvolatile memory device, a storage device including the same, and operation and read methods thereof.

Semiconductor memory devices may be classified into volatile semiconductor memory devices and nonvolatile semiconductor memory devices. The nonvolatile semiconductor memory devices may retain data stored therein even at power-off; on the other hand, data stored in the nonvolatile semiconductor memory device may be permanent or reprogrammable, depending upon the fabrication technology used. The nonvolatile semiconductor memory devices may be used for user data storage and program and microcode storage in a wide variety of applications in computer, avionics, telecommunications, and consumer electronics industries.

SUMMARY

According to an aspect of embodiments of the inventive concept, a method of operating a nonvolatile memory device is provided. The nonvolatile memory device includes at least one string connected to a bit line, the at least one string including a plurality of memory cells connected in series, each of the plurality of memory cells being connected to a respective word line among a plurality of word lines and stacked in a direction perpendicular to a substrate. The method includes applying a word line voltage needed for an operation to a first word line among the word lines, applying a recovery voltage higher than a ground voltage to the first word line after the operation, and then floating the first word line.

The first word line may be floated at the recovery voltage.

The method may further include setting up the first word line which is floated at the recovery voltage to a setup voltage before the applying the word line voltage to the first word line. The setup voltage may be a program pass voltage when the operation is a program operation. When the operation is a read operation and the first word line is a selected word line, the setup voltage may be a word line setup voltage, and the method may further included setting up a second word line which is an unselected word line to a read pass voltage, the read pass voltage being higher than the word line setup voltage. The applying the recovery voltage may include applying the recovery voltage to the second word line, and the floating the first word lines may include floating the second word line. Applying the word line voltage may include pre-charging the bit line and applying a read voltage to the selected word line to sense a voltage of the bit line.

The at least one string may include a string selection transistor connected to a string selection line and a ground selection transistor connected to a ground selection line, which are connected in series with the plurality of memory cell, and the string selection line and the ground selection line may be discharged from a first voltage to a second voltage which is lower than the first voltage during the applying the recovery voltage to the first word line. The first voltage may be a turn-on voltage and the second voltage may be the ground voltage.

The recovery voltage may be a power supply voltage.

According to another aspect of embodiments of the inventive concept, a method of operating a nonvolatile memory device is provided. The nonvolatile memory device includes a first string and a second string connected to a bit line, the first string including a first string selection transistor connected to a first string selection line, the second string including a second string selection transistor connected to a second string selection line, and each of the first string and the second string including a plurality of memory cells connected in series, each the plurality of memory cells connected to word lines and stacked in a direction perpendicular to a substrate. The method includes applying at least one word line voltage needed for an operation to the word lines, applying at least one recovery voltage higher than a ground voltage to the word lines, discharging the first string selection line from a first voltage to a second voltage during the applying the at least one recovery voltage, and floating the word lines.

The first voltage may be a turn-on voltage for the first string selection transistor, and the second voltage may be the ground voltage.

The second string selection transistor may be maintained with a turn-off voltage.

The word lines may be floated at the at least one recovery voltage.

The method may further include setting up the word lines which are floated at the at least one recovery voltage.

The setting up the word lines may include applying a read pass voltage to unselected word lines and a word line setup voltage to a selected word line, and wherein applying at least one word line voltage may include pre-charging the bit line and applying a read voltage to the selected word line to sense the bit line.

According to still another aspect of embodiments of the inventive concept, a nonvolatile memory device is provided which includes a memory cell array and a control logic. The memory cell array includes a plurality of strings connected to a bit line, each of the plurality of strings including a plurality of memory cells connected in series, each the plurality of memory cells connected to word lines and stacked in a direction perpendicular to a substrate. The control logic is configured to apply a word line voltage needed for an operation to a first word line among the word lines, to apply a recovery voltage higher than a ground voltage to the first word line after the operation, and then to float the first word line.

The control logic may set up the floated word lines by applying a read pass voltage to unselected word lines among the word lines and a word line setup voltage to a selected word line among the word lines.

The control logic may perform a read operation by pre-charging the bit line and applying a read voltage to a selected word line among the word lines to sense the bit line.

Each of the plurality of strings may include a string selection transistor connected to a string selection line and a ground selection transistor connected to a ground selection line, which are connected in a series with the plurality of memory cells, and the string selection line and the ground selection line may be discharged to the ground voltage during the applying the recovery voltage.

Each of the plurality of strings may include a string selection transistor connected to a string selection line and a ground selection transistor connected to a ground selection line, which are connected in a series with the plurality of memory cell, and the control logic may discharge the string selection line and the ground selection line to the ground voltage after the floating the word lines. The control logic may apply a read pass voltage to unselected word lines and a word line setup voltage to a selected word line, and then may apply a read voltage to the selected word line.

The plurality of strings may include a selected string selection transistor connected to a selected string selection line and unselected string selection transistors connected to unselected string selection lines, and the unselected string selection transistors may be turned-on during a first predetermined time when the word lines are set up. The unselected string selection transistors may be turned-on during a second predetermined time when the word lines are floated at the recovery voltage. The selected string selection line and the ground selection line may be discharged to the ground voltage after the second predetermined time.

The plurality of strings may include memory cells connected to a selected word line, and unselected memory cells connected to unselected word lines, and a first read voltage may be applied to the selected word line in a first read period of the read operation, a second read voltage higher than the first read voltage may be applied to the selected word line in a second read period of the read operation, and then the selected word line and the unselected word lines may be floated at the recovery voltage.

The word lines may be divided into a plurality of groups, and different word line voltages may be applied to at least two of the plurality of groups.

The floated word lines may be discharged according to at least one of an external request and an internal request.

According still another aspect of embodiments of the inventive concept, a storage device is provided which includes a nonvolatile memory device and a memory controller. The nonvolatile memory device includes a plurality of strings connected to a bit line, each of the plurality of strings including a plurality of memory cells connected in a series, each the plurality of memory cells connected to word lines and stacked in a direction perpendicular to a substrate. The memory controller is configured to control the nonvolatile memory device. The nonvolatile memory device is configured to apply a word line voltage needed for an operation to a first word line among the word lines, to apply a recovery voltage higher than a ground voltage to the first word line after the operation, and then to float the first word line.

The nonvolatile memory device may set up the floated word lines by applying a read pass voltage to unselected word lines and a word line setup voltage to a selected word line.

According to an embodiment of the inventive concept, there is provided a recovery method of a nonvolatile memory device which includes a plurality of memory blocks each having a plurality of strings connected between bit lines and a common source line, the strings including pillars penetrating at least one ground selection line, a plurality of word lines, and at least one string selection line stacked in a direction perpendicular to a substrate. The recovery method includes: performing a first recovery operation in which word lines are discharged to a first voltage; and performing a second recovery operation in which the at least one string selection line and the at least one ground selection line are discharged to a second voltage different from the first voltage.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
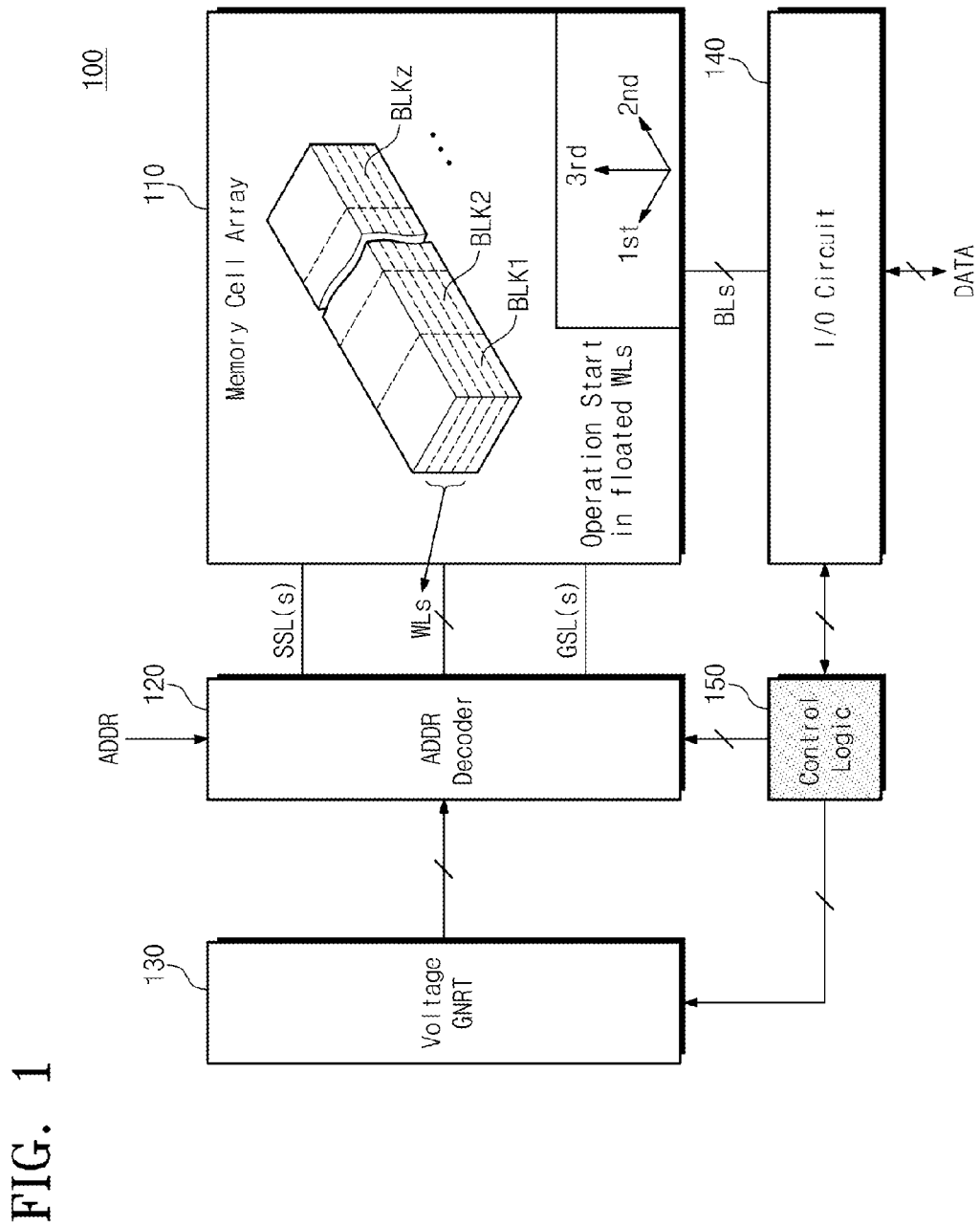
FIG. 1 is a block diagram schematically illustrating a nonvolatile memory device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to an embodiment of the inventive concept may begin to operate under such a condition that word lines have been floated with a predetermined voltage (hereinafter, referred to as "recovery voltage") higher than a ground voltage (e.g. 0 V), or may perform a recovery operation in which word lines are floated at the recovery voltage.

FIG. 1 is a block diagram schematically illustrating a nonvolatile memory device according to an embodiment of the inventive concept. Referring to FIG. 1, a nonvolatile memory device 100 includes a memory cell array 110, an address decoder 120, a voltage generation circuit 130, an input/output circuit 140, and control logic 150.

The nonvolatile memory device 100 may be formed of, but not limited to, a NAND flash memory device, a NOR flash memory device, a Resistive Random Access Memory (RRAM) device, a Phase-Change Memory (PRAM) device, a Magnetoresistive Random Access Memory (MRAM) device, a Ferroelectric Random Access Memory (FRAM) device, or a Spin Transfer Torque Random Access Memory (STT-RAM) device. Also, the nonvolatile memory device 100 may be implemented to have a three-dimensional array structure. Not only is the inventive concept applicable to a flash memory device, in which a charge storage layer is made up of a conductive floating gate, but it is also applicable to a Charge Trap Flash (CTF) memory device, in which a charge storage layer is made up of an insulation film. Below, the nonvolatile memory device 100 is referred to as a vertical NAND flash memory device (VNAND).

The memory cell array 110 includes a plurality of memory blocks BLK1 to BLKz (z being an integer of 2 or more), each of which is connected to the address decoder 120 via word lines, at least one string selection line SSL, and at least one ground selection line GSL and to the input/output circuit 140 via bit lines. In exemplary embodiments, the word lines may be formed to have a shape where plates are stacked.

The memory blocks BLK1 to BLKz may include a plurality of strings that are three-dimensionally arranged on a substrate along a first direction and a second direction different from the first direction and along a third direction (i.e., a direction perpendicular to a plane formed in the first and second directions). Herein, each string may contain at least one string selection transistor, a plurality of memory cells, and at least one ground selection transistor that are connected in series in a direction perpendicular to the substrate. Each memory cell may store one or more bits. In exemplary embodiments, at least one dummy cell may be provided between at least one string selection transistor and a plurality of memory cells. As another example, at least one dummy cell may be provided between a plurality of memory cells and at least one ground selection transistor.

The address decoder 120 selects one of the memory blocks BLK1 to BLKz in response to an address. The address decoder 120 is connected to the memory cell array 110 through the word lines, the at least on string selection line SSL, and the at least one ground selection line GSL. The address decoder 120 selects the word lines, the at least one string selection line SSL, and the at least one ground selection line GSL using a decoded row address. The address decoder 120 decodes a column address of an input address. Herein, the decoded column address may be transferred to the input/output circuit 140. In exemplary embodiments, the address decoder 120 may include, but not limited to, a row decoder, a column decoder, an address buffer, and so on.

The voltage generation circuit 130 generates driving voltages, such as a program voltage, a pass voltage, a read voltage, a read pass voltage, a verification voltage, an erase operation, a common source line voltage, a well voltage, and so on. The voltage generation circuit 130 also generates a word line voltage needed for a program/read/erase operation. Under a control of the control logic 150, the voltage generation circuit 130 generates a word line voltage that selectively has an offset pulse. That is, the voltage generation circuit 130 may generate either a word line voltage having an offset pulse or a word line voltage not having an offset pulse.

The input/output circuit 140 is connected to the memory cell array 110 through the bit lines. The input/output circuit 140 is configured to receive the decoded column address from the address decoder 120. The input/output circuit 140 selects the bit lines using the decoded column address. The input/output circuit 140 may contain a plurality of page buffers that store program data at a program operation and reads data at a read operation. Herein, each of the page buffers may include a plurality of latches. During a program operation, data stored in the page buffers may be programmed at a page of a selected memory block. During a read operation, data read from a page of a selected memory block may be stored in the page buffers via the bit lines. Meanwhile, the input/output circuit 140 reads data from a first area of the memory cell array 110 and then stores the read data in a second area of the memory cell array 110. For example, the input/output circuit 140 is configured to perform a copy-back operation.

The control logic 150 controls an overall operation of the nonvolatile memory device 100, including, but not limited to, a program operation, a read operation, an erase operation, and so on. The control logic 150 operates in response to control signals or commands that are provided from the external device. The control logic 150 may be implemented to start an operation under a condition in which word lines have been floated. The control logic 150 may be implemented to float word lines with a recovery voltage Vrcv during a recovery operation. In particular, to reduce read disturbance, the control logic 150 may perform a read recovery operation in which word lines with the recovery voltage Vrcv are floated.

In exemplary embodiments, recovery voltages for program, read, and erase operations may be identical to or different from one another.

The nonvolatile memory device 100 according to an embodiment of the inventive concept begins to operate under a condition where word lines have been floated, thereby making is possible to markedly reduce a time taken to set up word lines (word line setup time). The nonvolatile memory device 100 according to an embodiment of the inventive concept floats word lines with the recovery voltage Vrcv higher than the ground voltage (e.g. 0 V) during a recovery operation, thereby reducing read disturbance.

Figure 2:
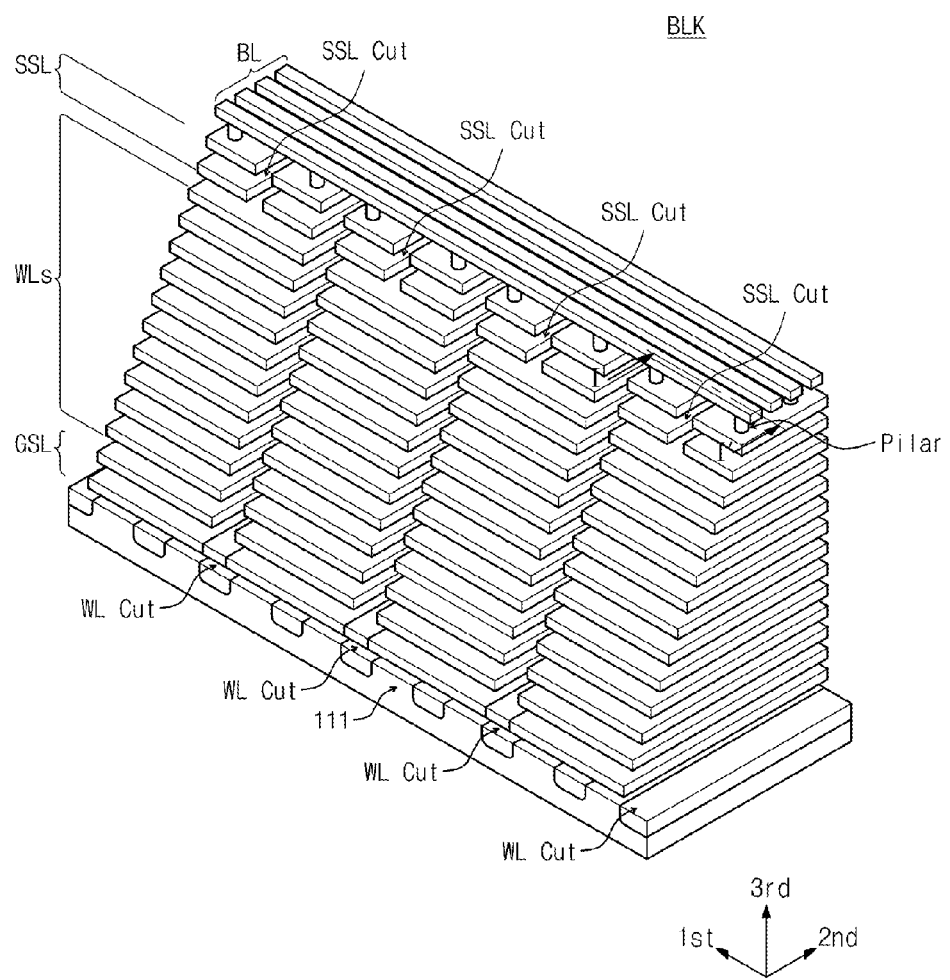
FIG. 2 is a perspective view of a memory block BLK shown in FIG. 1.

FIG. 2 is a perspective view of a memory block BLK shown in FIG. 1. Referring to FIG. 2, four sub blocks are formed on a substrate. Each sub block is formed by stacking and cutting at least one ground selection line GSL, a plurality of word lines, and at least one string selection line SSL on the substrate in a plate shape. In exemplary embodiments, the at least one string selection line SSL may be separated by string selection line cuts. In exemplary embodiments, at least one plate-shaped dummy line may be formed between the ground selection line GSL and the word lines. Or, at least one plate-shaped dummy line may be formed between the word lines and the string selection line SSL.

Although not shown in FIG. 2, each word line cut may include a common source line CSL. In exemplary embodiments, the common source lines CSL included in the word line cuts may be interconnected. A string may be formed in such a way that a pillar connected to a bit line penetrates the at least one string selection line SSL, the word lines, and the at least one ground selection line GSL.

In FIG. 2, an embodiment of the inventive concept exemplified as a structure between word line cuts adjacent to each other is a sub block. However, the inventive concept is not limited thereto. For example, a structure between a word line cut and a string selection line cut may be defined as a sub block. The memory block BLK according to an embodiment of the inventive concept may be implemented to have a merged word line structure where two word lines are merged to one.

Figure 3:
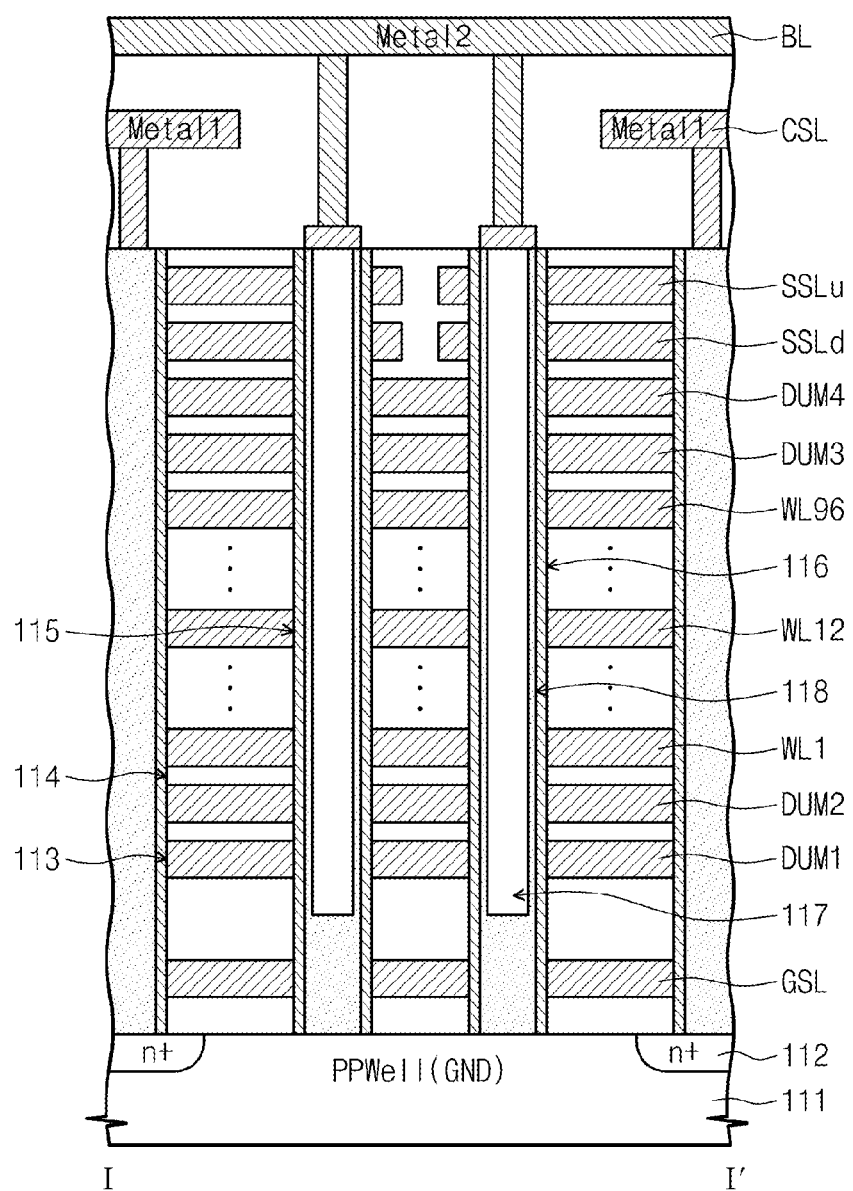
FIG. 3 is a cross-sectional view taken along a line I-I' of a memory block shown in FIG. 2.

FIG. 3 is a cross-sectional view taken along a line I-I' of a memory block shown in FIG. 2. Referring to FIG. 3, a memory block BLK is formed in a direction perpendicular to a substrate 111. An n+ doping region 112 is formed in the substrate 111. A gate electrode layer 113 and an insulation layer 114 are deposited on the substrate 111 in turn. An information storage layer 115 is formed on lateral surfaces of the gate electrode layer 113 and the insulation layer 114. The gate electrode layer 113 is connected to a ground selection line GSL, a plurality of word lines, and a string selection line.

The information storage layer 115 includes a tunnel insulation layer, a charge storage layer, and a blocking insulation layer. The tunnel insulation layer may act as an insulation layer where charge moves due to the tunneling effect. The charge storage layer may be made up of an insulation layer that traps charge. The charge storage layer may be formed of SiN or a metal (aluminum or hafnium) oxide layer. Between the gate electrode layer and the charge storage layer, the blocking insulation layer may act as an insulation layer. The blocking insulation layer may be formed of a silicon oxide layer. In exemplary embodiments, the tunnel insulation layer, charge storage layer, and blocking insulation layer may constitute an ONO (Oxide-Nitride-Oxide) structure of insulation layer.

A pillar 116 is formed by vertically patterning the gate electrode layer 113 and the insulation layer 114. The pillar 116 penetrates the gate electrode layers 113 and the insulation layers 114 and is connected between a bit line and the substrate 111. The inside of the pillar 116 forms a filing dielectric pattern and is made up of an insulation material such as silicon oxide or air gap. The outside of the pillar 116 forms a vertical active pattern 118 and is made up of channel semiconductor. In exemplary embodiments, the vertical active pattern 118 is formed of a p-type silicon layer. A memory cell included in a string may be defined by the dielectric pattern 117, the vertical active pattern 118, the information storage layer 115, and the gate electrode layer 113 that are sequentially disposed from the inside of the pillar 116. Common source lines CSL extend on the n+ doping regions 112. The common source lines CSL may be included in word line cuts in a wall shape.

Figure 4:
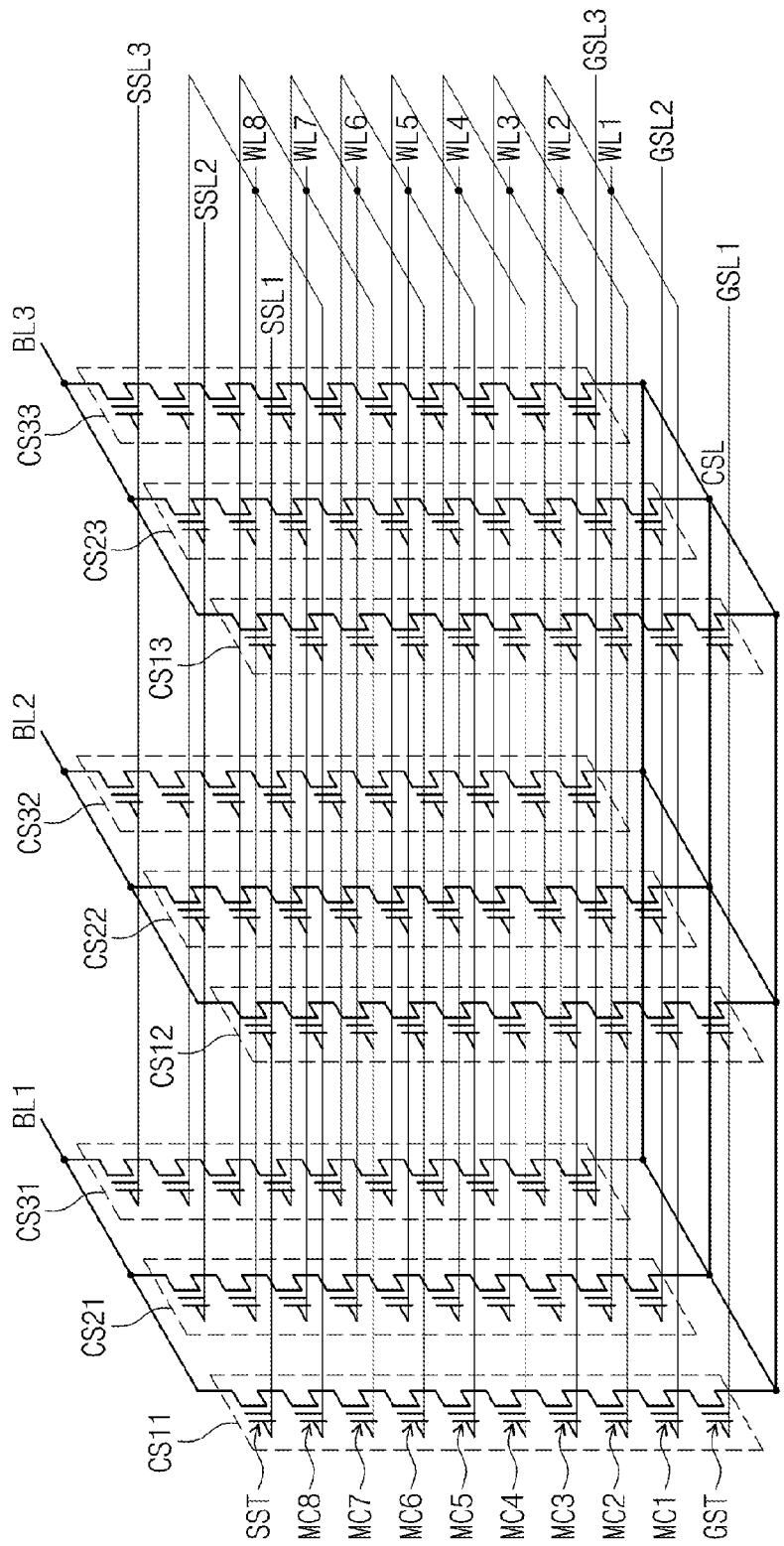
FIG. 4 is a circuit diagram schematically illustrating an equivalent circuit of a memory block BLK shown in FIG. 2, according to an embodiment of the inventive concept.

FIG. 4 is a circuit diagram schematically illustrating an equivalent circuit of a memory block BLK shown in FIG. 2, according to an embodiment of the inventive concept. Referring to FIG. 4, cell strings CS11 to CS33 are connected between bit lines BL1 to BL3 and a common source line CSL. Each cell string (e.g., CS11) includes a string selection transistor SST, a plurality of memory cells MC1 to MC8, and a ground selection transistor GST. In FIG. 4, there is illustrated an example in which a string includes eight memory cells. However, the inventive concept is not limited thereto.

The string selection transistors SST are connected to a string selection line SSL. The string selection lines SSL are divided into first to third string selection lines SSL1 to SSL3. In FIG. 4, there are illustrated three string selection line SSL1 to SSL3 corresponding to a bit line. However, the inventive concept is not limited thereto. The memory block BLK of the inventive concept may be implemented to include at least two string selection lines corresponding to a bit line.

The ground selection transistors GST are connected to a ground selection line GSL. Also, the string selection transistors SST are connected to bit lines BL1 to BL3 and the ground selection transistors GST are connected to the common source line CSL.

In each string, the memory cells MC1 to MC8 are connected to corresponding word lines WL1 to WL8. A set of memory cells that are connected to a word line and programmed at the same time may be referred to as a page. The memory block BLK is formed of a plurality of pages. Also, a word line is connected with a plurality of pages. Referring to FIG. 4, a word line (e.g., WL4) with the same height from the common source line CSL is connected in common to three pages.

Meanwhile, each memory cell may store 1-bit data or two or more bits of data. A memory cell storing 1-bit data may be referred to as a single-level cell (SLC) or a single-bit cell. A memory cell storing two or more bits of data may be referred to as a multi-level cell (MLC) or a multi-bit cell. In a 2-bit MLC, two pages of data may be stored at a physical page. In a 3-bit MLC, six pages of data may be stored at a physical page.

A nonvolatile memory device 100 may be implemented with a charge trap flash (CTF) memory device. In this case, there may be generated the initial verify shift (IVS) phenomenon where charge trapped in a programmed CTF is redistributed and leaked over the lapse of time. Reprogramming may be performed to overcome such distribution deterioration.

The memory block BLK shown in FIG. 4 has a structure in which a ground selection line GSL is divided into two or more lines. However, the inventive concept is not limited thereto. For example, the ground selection line GSL may be implemented to have a shared structure.

Figure 5:
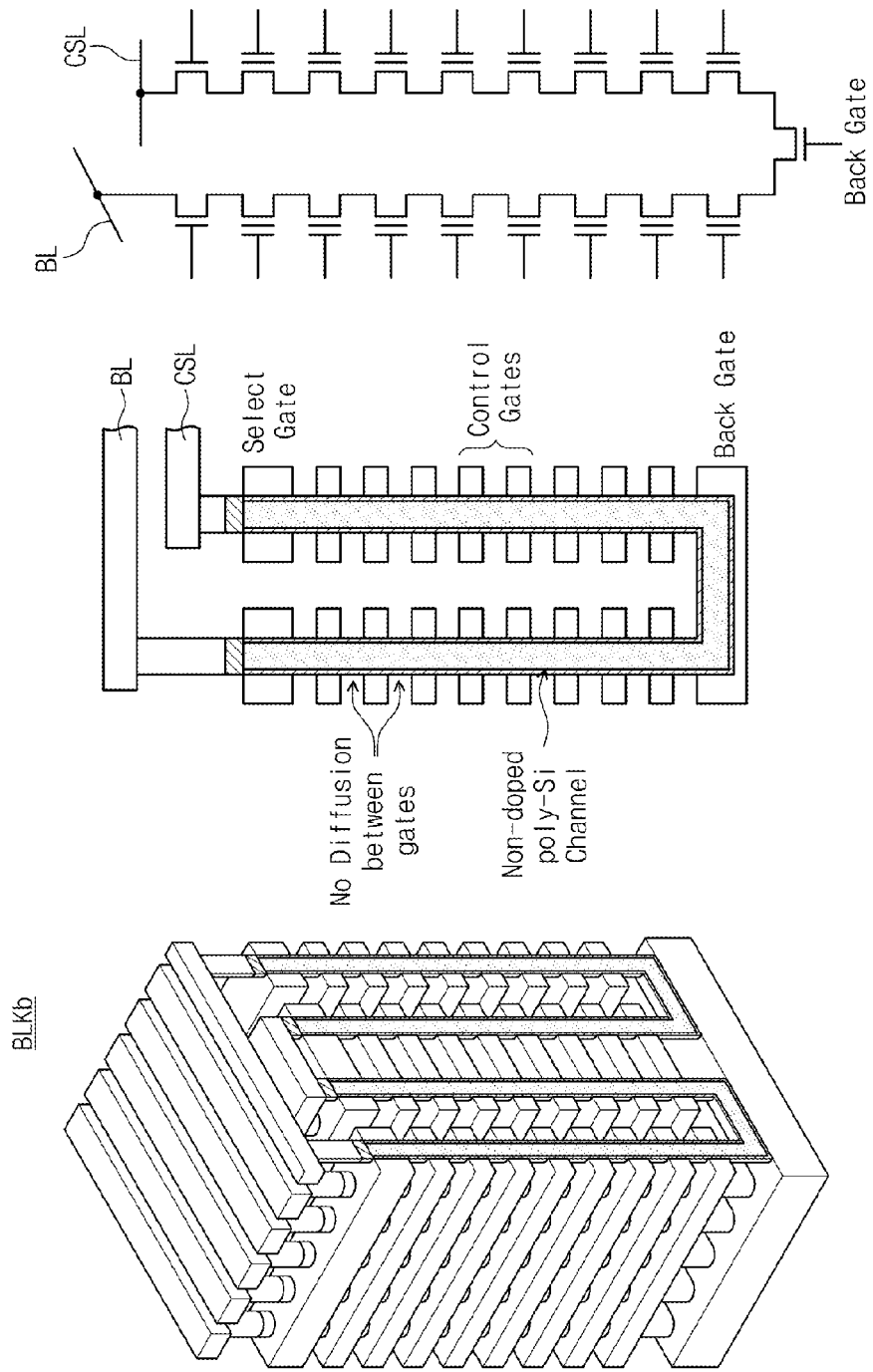
FIG. 5 is a diagram schematically illustrating a memory block according to another embodiment of the inventive concept.

FIG. 5 is a diagram schematically illustrating a memory block according to another embodiment of the inventive concept. Referring to FIG. 5, a string is formed between a bit line BL and a common source line CSL and includes first memory cells formed between the bit line BL and a substrate in a vertical direction and second memory cells formed between the substrate and a common source line CSL in the vertical direction. That is, the string has a pipe shape and is formed of two pillars.

A memory block BLKb includes a plurality of strings, each of which contains at least two pillars penetrating plate-shaped word lines. The at least two pillars may be interconnected via a pillar connection portion that a back gate formed on a substrate contains. Each pillar may be arranged on the substrate in a first direction and a second direction (different from the first direction) and in a third direction (a direction perpendicular to a plane formed in the first and second directions). Each pillar may contain a cylindrical semiconductor layer extending in a direction perpendicular to the substrate, an insulation layer encompassing the semiconductor layer, and a charge accumulation layer encompassing the insulation layer.

In FIG. 5, each string is illustrated as being formed of two pillars. Each of the strings may include at least one string selection transistor, first memory cells (or, first cell transistors), a back-gate transistor, second memory cells (or, second cell transistors), and at least one ground selection transistor that are connected in series between a bit line and a common source line. Each of the first and second memory cells may be implemented with a stack gate type transistor that includes an insulation layer, a charge accumulation layer, an insulation layer, a control gate, and so on. Each of the first and second memory cells may store at least one bit. At least one dummy cell may be placed between at least one string selection transistor and the first memory cells.

Also, at least one dummy cell may be provided between the second memory cells and at least one ground selection transistor. The back-gate transistor may contain a pipeline-structured pillar connection portion that connects a first pillar corresponding to the first memory cells and a second pillar corresponding to the second memory cells. The pillar connection portion may be buried in the back gate. The pillar connection portion and the back gate may constitute a back-gate transistor. The pillar connection portion may become conductive according to a back-gate voltage that is applied to the back gate.

In exemplary embodiments, the memory block BLKb may have a P-BiCS (pipe-shaped bit cost scalable) structure where a bit line and a source line are stacked above memory cells. In exemplary embodiments, a channel may be connected directly to the substrate.

Figure 6:
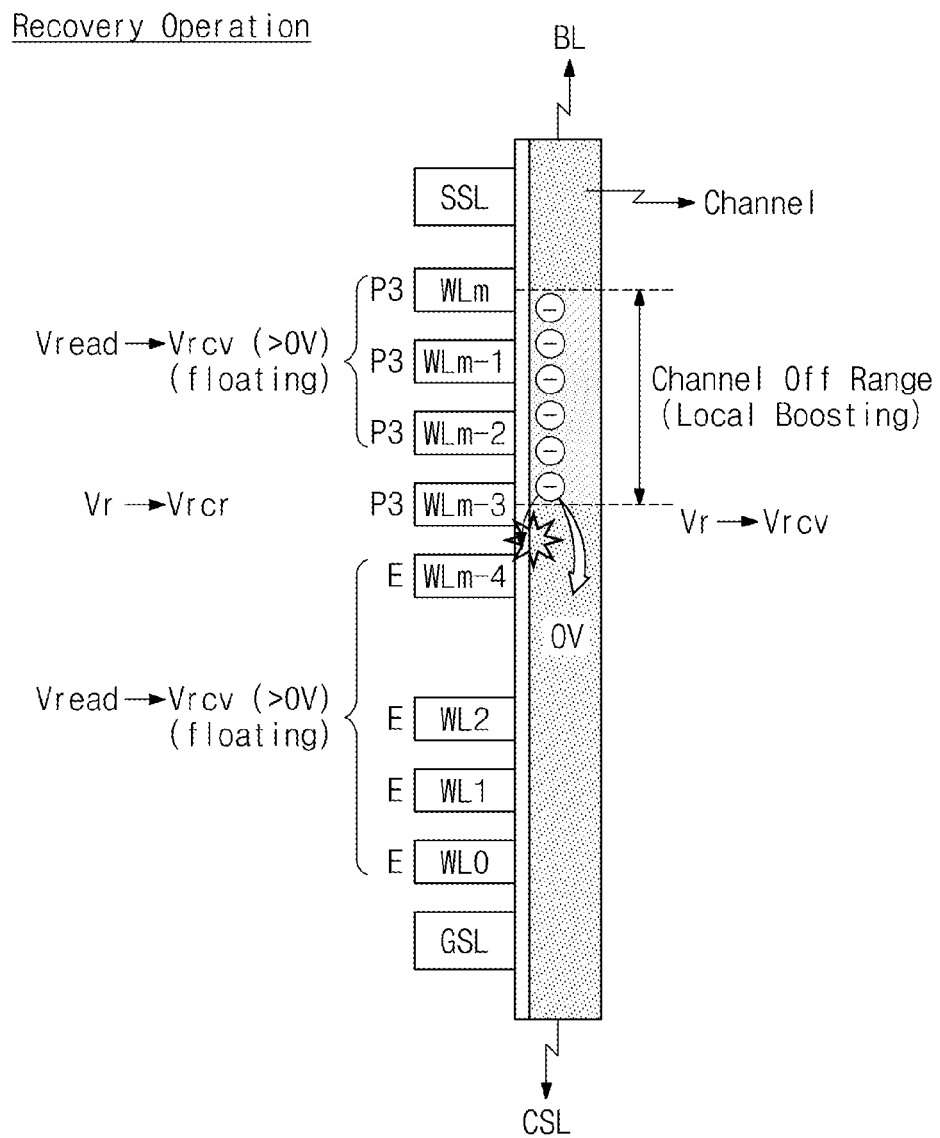
FIG. 6 is a conceptual diagram for describing read disturbance being reduced at a read recovery operation according to an embodiment of the inventive concept.

FIG. 6 is a conceptual diagram for describing how read disturbance is reduced at a read recovery operation according to an embodiment of the inventive concept. In FIG. 6, it is assumed that memory cells connected to a selected word line WLm-3 and upper word lines WLm, WLm-1, and WLm-2 of the selected word line WLm-3 all have the uppermost state P3. A channel-off range, that is, a local boosting range that is defined by the memory cells connected to the selected word line WLm-3 and the upper word lines WLm, WLm-1, and WLm-2 may be formed in a channel of a string (hereinafter, referred to as "string channel").

In a typical nonvolatile memory device, the upper word lines WLm, WLm-1, and WLm-2 may be discharged from a read pass voltage Vread to a ground voltage GND at a recovery operation following a read operation. Charge in the channel-off range may undergo negative down-coupling. This is referred as to "negative boosting" or "under coupling". The negative boosting may cause an increase in negative charge at the channel-off range.

A path through which the increased negative charge is discharged may not exist because a channel has been shut off. At this time, the channel-off range may have a negative voltage due to the under boosting, and channels of memory cells connected to lower word lines WLm-4 to WL0 of the selected word line WLm-3 may be connected to a common source line CSL, that is, a ground voltage GND (e.g., 0 V). With this bias condition, a difference between the negative voltage of the channel-off range and the ground voltage (0 V) may increase, thereby causing BTBT (band to band tunneling) or HCI (hot carrier injection). A memory cell that has an erase state E and is connected to the word line WLm-4 may be programmed due to the BTBT or HCI, thereby resulting in read disturbance. As a read voltage Vr becomes high and the number of read operations increases, the read disturbance may grow bigger.

In contrast, because a nonvolatile memory device 100 according to an embodiment of the inventive concept may be configured to float word lines WL1 to WLm with a recovery voltage Vrcv, there is reduced read disturbance due to the under coupling at the recovery operation. That is, the word lines WL1 to WLm are discharged to the recovery voltage Vrcv higher than 0 V, thereby preventing the channel-off range from being formed in a string channel. This means that the read disturbance is prevented.

In exemplary embodiments, the recovery voltage Vrcv may be higher than a read pass voltage Vread. The recovery voltage Vrcv may be a positive voltage that is sufficient to turn on a memory cell having the uppermost state P3. For example, the recovery voltage Vrcv may be a power supply voltage VDD.

The nonvolatile memory device 100 according to an embodiment of the inventive concept may be configured to float word lines with the recovery voltage Vrcv in a recovery operation, thereby preventing the read disturbance.

Figure 7:
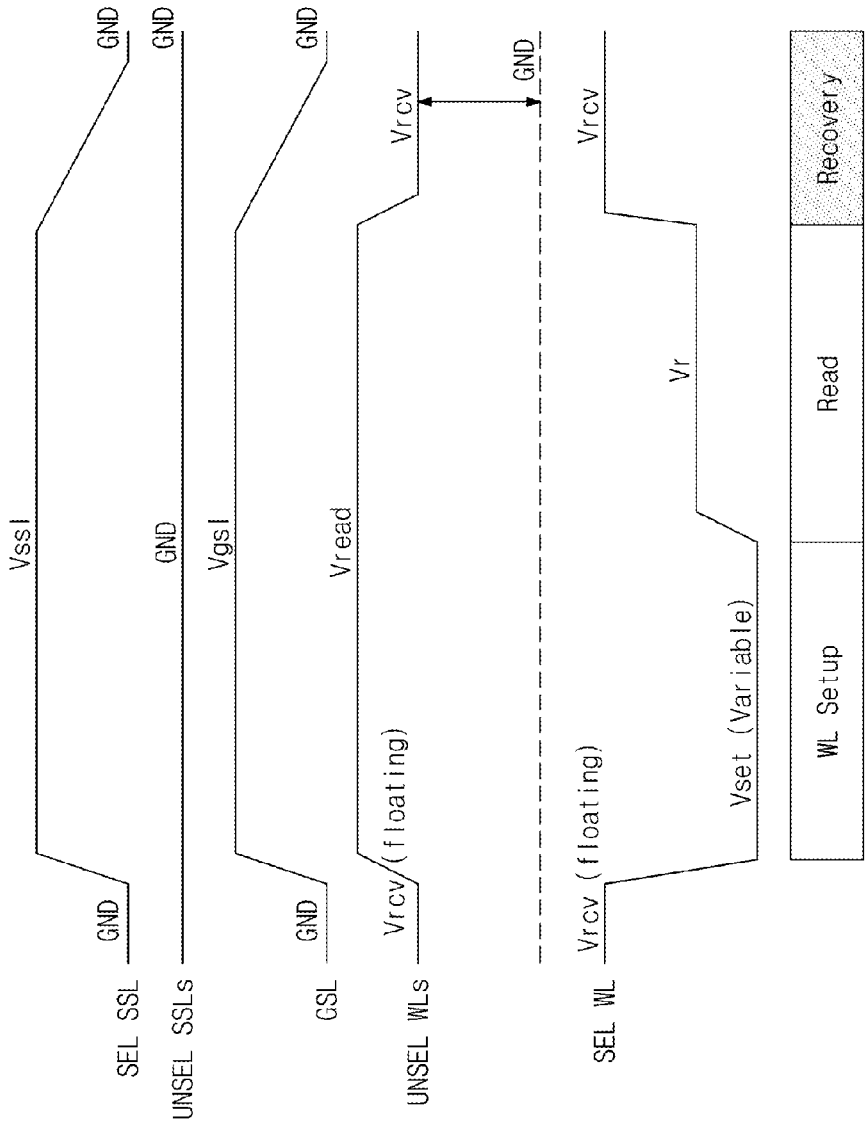
FIG. 7 is a timing diagram of a read operation according to a first embodiment of the inventive concept.

FIG. 7 is a timing diagram of a read operation according to a first embodiment of the inventive concept. Referring to FIGS. 1 to 7, a read operation may contain a word line setup period, a read period, and a recovery period. In the word line setup period, a word line setup voltage Vset is applied to a selected word line SEL WL and a read pass voltage Vread is applied to unselected word lines UNSEL WLs. In exemplary embodiments, word lines (including selected and unselected word lines) having a recovery voltage Vrcv may have been floated before the word line setup period. In exemplary embodiments, the word line setup voltage Vset may have a fixed value. In other exemplary embodiments, the word line setup voltage Vset may vary according to the read voltage Vr.

With the above description, the unselected word lines that have been floated with a predetermined voltage may be set to the read pass voltage Vpass, thereby reducing a word line setup time. In the word line setup period, a string selection voltage Vssl is applied to a selected string selection line SEL SSL, a ground voltage GND to unselected string selection lines UNSEL SSLs, and a ground selection voltage Vgsl to a ground selection line GSL.

In the read period, there is performed a sensing operation for determining whether memory cells are turned on or off, using a read voltage Vr. A value of data stored in each memory cell may be determined according to a result of the sensing operation. In exemplary embodiments, during the read period, string selection lines and a ground selection line may maintain states determined in the word line setup period.

In the recovery period, the selected and unselected word lines SEL WL and UNSEL WLs may be discharged to the recovery voltage Vrcv. That is, the word lines having the recovery voltage Vrcv may be floated. In addition, the string selection lines and the ground selection line(s) may be grounded in the recovery period. With the read operation of the inventive concept, word lines are set to the recovery voltage Vrcv at the recovery operation, thereby preventing a channel-off range from being formed.

In the recovery period shown in FIG. 7, string/ground selection lines and word lines may be discharged at the same point in time. However, the inventive concept is not limited thereto. For example, a discharge point in time of the string/ground selection lines may be later than that of the word lines.

Figure 8:
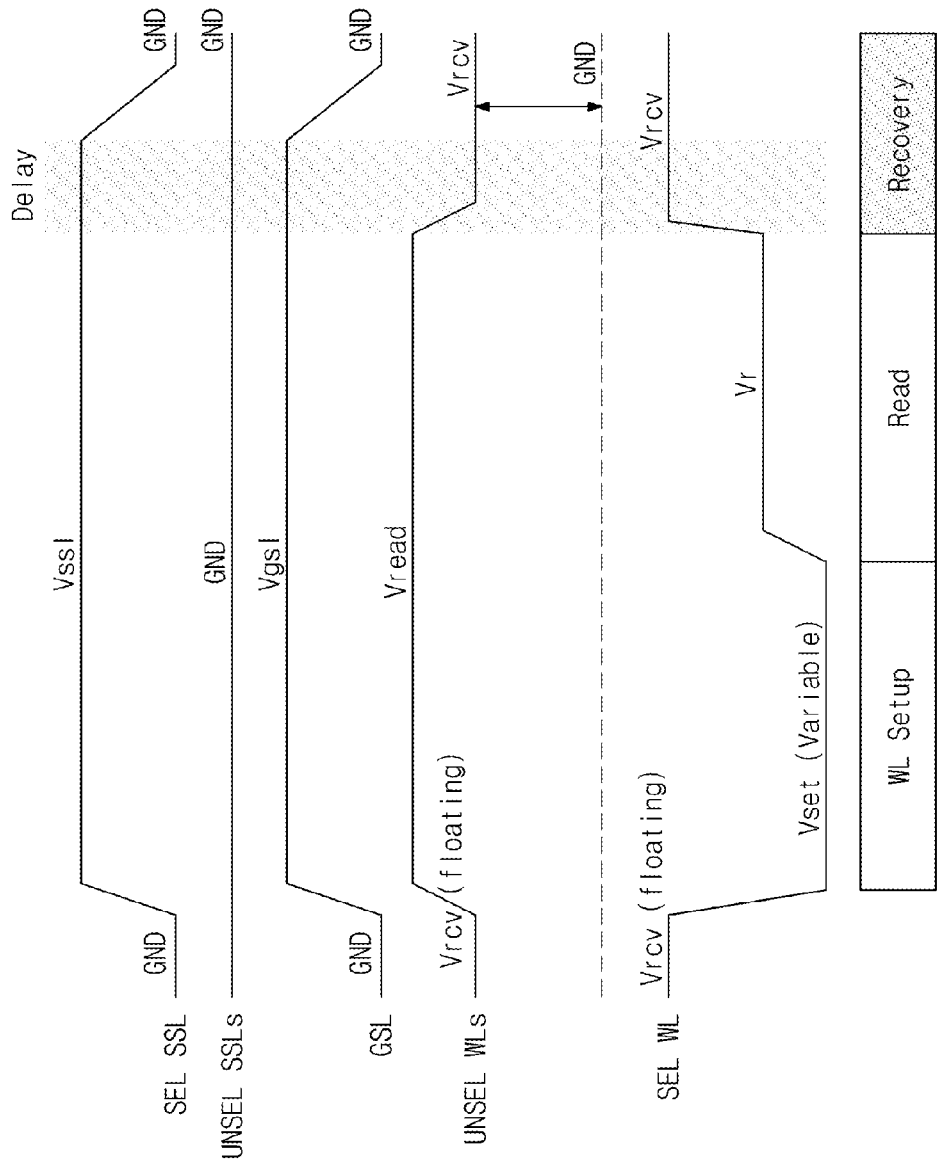
FIG. 8 is a timing diagram of a read operation according to a second embodiment of the inventive concept.

FIG. 8 is a timing diagram of a read operation according to a second embodiment of the inventive concept. Referring to FIGS. 1 to 6 and 8, a discharge point in time of string/ground selection lines may be later by a predetermined delay time than that of the word lines. In read operations described with reference to FIGS. 7 and 8, unselected string selection lines may be maintained with a ground voltage GND. However, the inventive concept is not limited thereto. A read operation according to an embodiment of the inventive concept may be changed or modified in such a way that a voltage is applied to an unselected string selection line to discharge channel charge.

Figure 9:
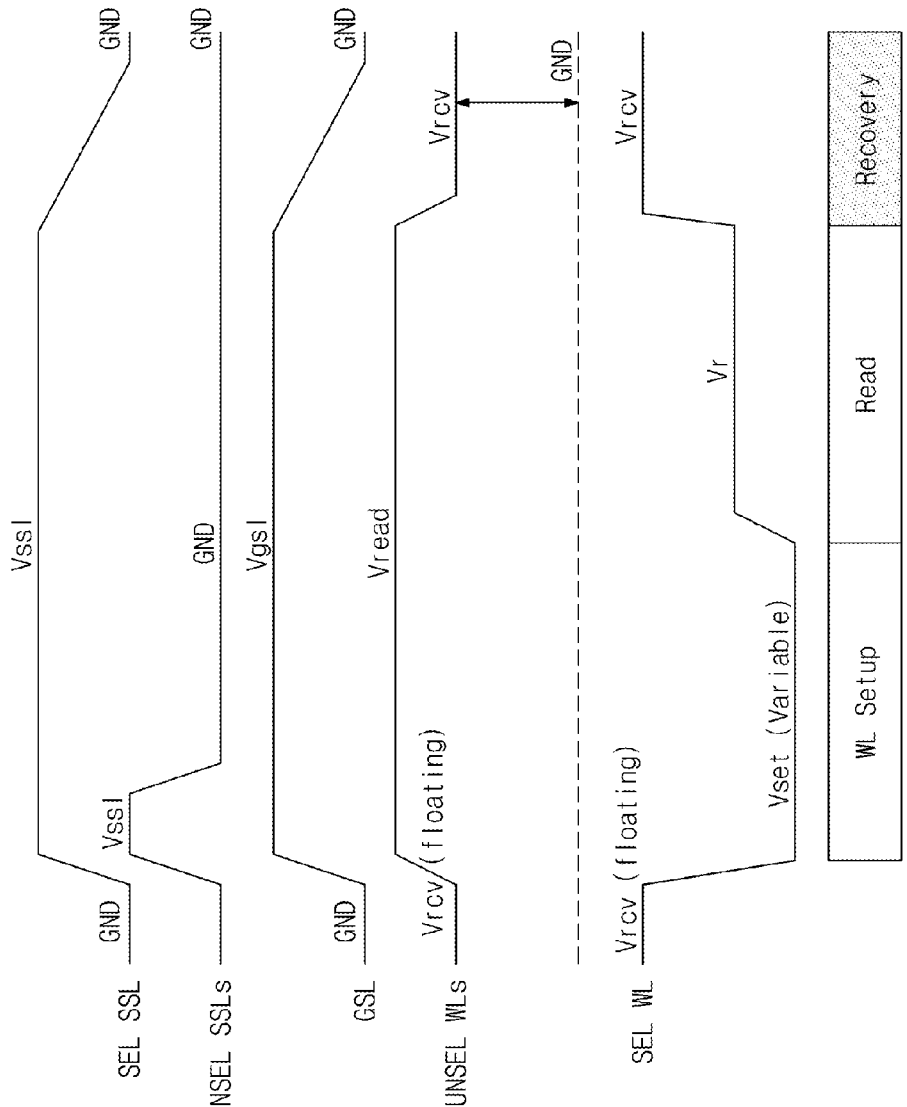
FIG. 9 is a timing diagram of a read operation according to a third embodiment of the inventive concept.

FIG. 9 is a timing diagram of a read operation according to a third embodiment of the inventive concept. Referring to FIGS. 1 to 6 and 9, in a word line setup period of a read operation, a string selection voltage Vssl is applied to unselected string selection lines UNSEL SSLs during a predetermined time. During the read operation, as illustrated in FIG. 9, a string selection voltage Vssl is applied to unselected string selection lines UNSEL SSLs only during a word line setup period. However, the inventive concept is not limited thereto. For example, a read operation according to an embodiment of the inventive concept may be modified or changed in such a way that not only is the string selection voltage Vssl applied to the unselected string selection lines UNSEL SSLs in a word line setup period, but it is also applied to the unselected string selection lines UNSEL SSLs in the recovery period.

Figure 10:
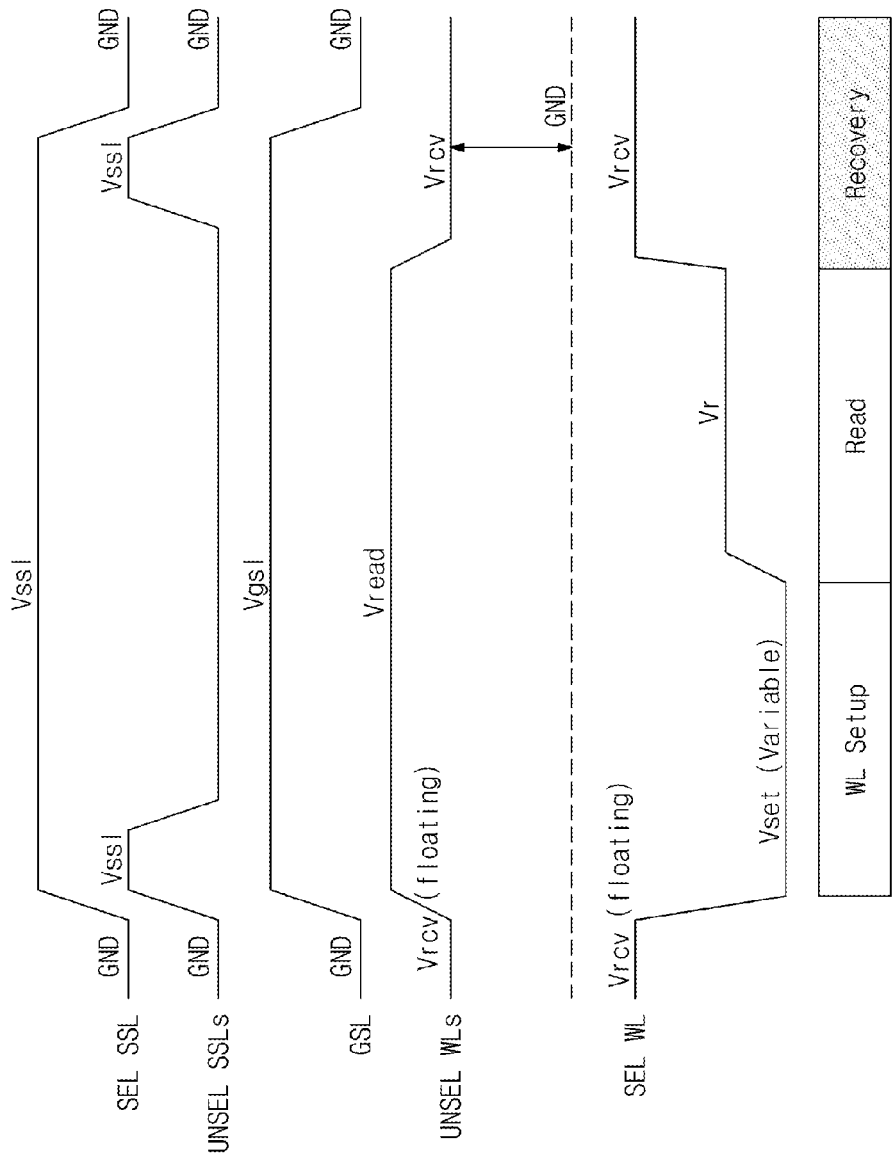
FIG. 10 is a timing diagram of a read operation according to a fourth embodiment of the inventive concept.

FIG. 10 is a timing diagram of a read operation according to a fourth embodiment of the inventive concept. Referring to FIGS. 1 to 6 and 10, in a recovery period and a word line setup period of a read operation, a string selection voltage Vssl is applied to unselected string selection lines UNSEL SSLs during a predetermined time. After a time elapses, string/ground selection lines are discharged.

In FIGS. 7 to 10, there has been described an embodiment where a read operation is performed using one read level Vr. However, the inventive concept is not limited thereto. The inventive concept is applicable to a read operation about a multi-bit memory cell.

Figure 11:
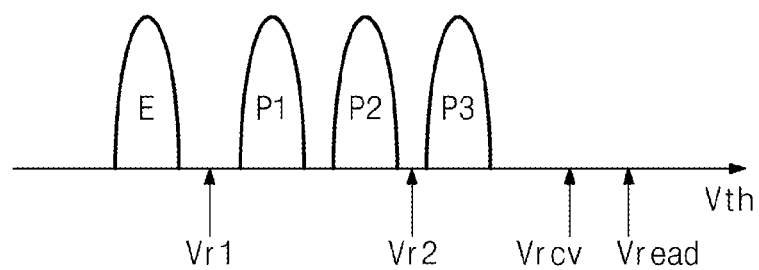
FIG. 11 is a diagram showing a threshold voltage distribution of a 2-bit memory cell, according to an embodiment of the inventive concept.

FIG. 11 is a diagram showing a threshold voltage distribution about a 2-bit memory cell, according to an embodiment of the inventive concept. Referring to FIG. 11, a memory cell may have one of an erase state E and program states P1 to P3. A read operation of the inventive concept will be described under an assumption that two read levels Vr1 and Vr2 are used to read data stored in a memory cell. A recovery voltage Vrcv may be lower than a read pass voltage Vread and higher than an upper limit voltage corresponding to an upper limit of the uppermost program state P3.

Figure 12:
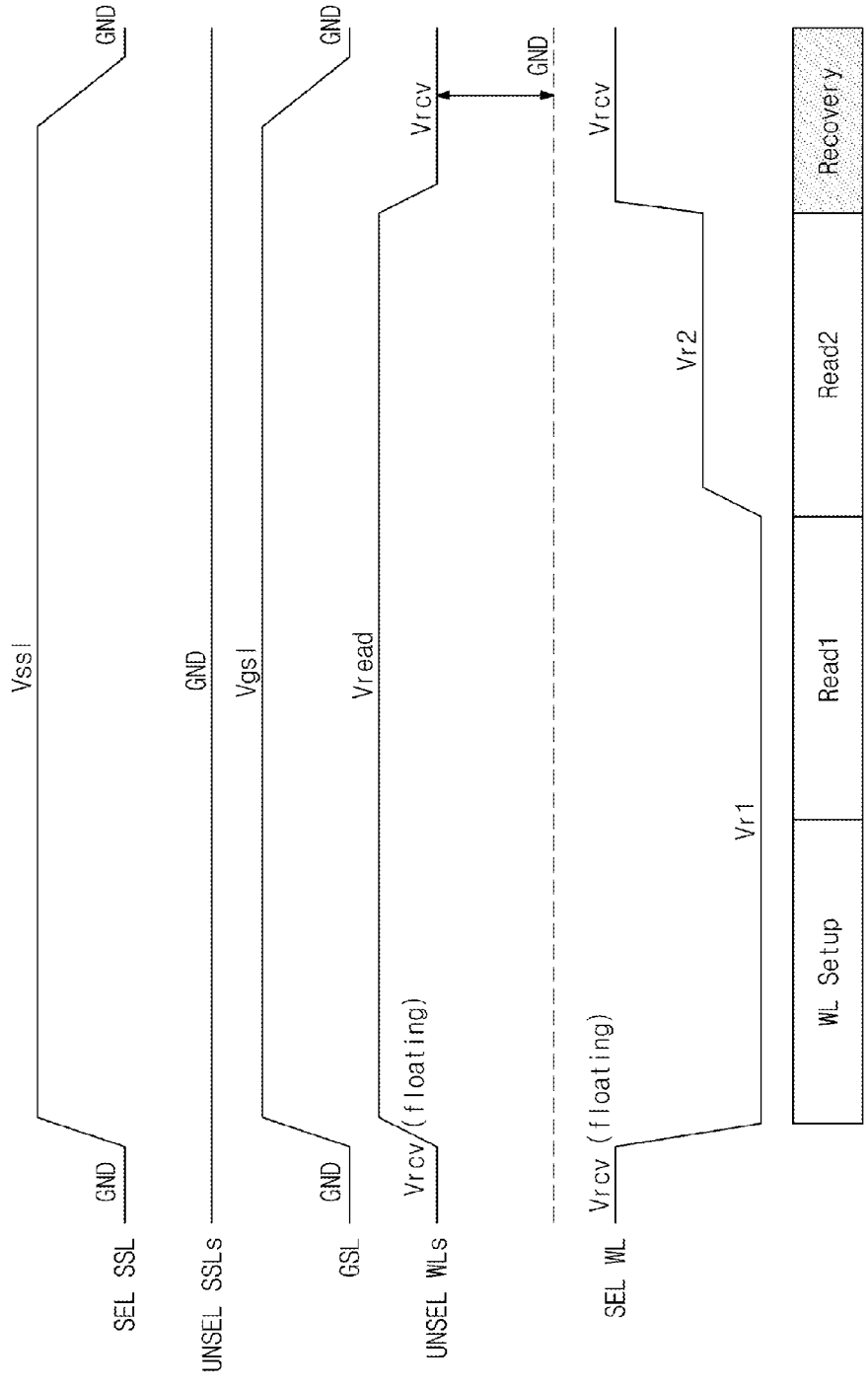
FIG. 12 is a timing diagram of a read operation of a 2-bit memory cell, according to an embodiment of the inventive concept.

FIG. 12 is a timing diagram of a read operation about a 2-bit memory cell, according to an embodiment of the inventive concept. A read operation will now be described with reference to FIGS. 1 to 12.

In a word line setup period, a first read voltage Vr1 is applied to a selected word line SEL WL of a floating state and a read pass voltage Vread is applied to unselected word lines UNSEL of a floating state. In exemplary embodiments, in the word line setup period, a string selection voltage Vssl, a ground voltage GND, and a ground selection voltage Vgsl may be applied to a selected string selection line SEL SSL, unselected string selection lines UNSEL SSLs, and a ground selection line GSL, respectively.

During a first read period, there is performed an operation of sensing an on/off state of a memory cell using the first read voltage Vr1. In exemplary embodiments, during the first read period, string and ground selection lines may maintain states determined at the word line setup period. Next, there is performed an operation of sensing an on/off state of a memory cell using a second read voltage Vr2. A value of data stored in a memory cell may be determined according to results of the sensing operations. In exemplary embodiments, during the second read period, string and ground selection lines may maintain states determined at the word line setup period.

In a recovery period, word lines (including selected and unselected word lines) are discharged to a recovery voltage Vrcv. That is, after being set to the recovery voltage Vrcv, the word lines are floated. In other words, the floated word lines may have the recovery voltage Vrcv. During the recovery period, the string and ground selection lines are discharged to a ground voltage GND. As described above, it is possible to provide unselected string selection lines with a pre-pulse during a word line setup period and with a post-pulse during a recovery period.

In the recovery period described with reference to FIGS. 7 to 12, string and ground selection lines may be discharged at the same point in time. However, the inventive concept is not limited thereto. For example, the string selection line and the ground selection line may be discharged at different points in time.

In read operations described with reference to FIGS. 7 and 12, a read pass voltage applied to unselected word lines during a word line setup period may be the same as that applied to the unselected word lines during a read period. However, the inventive concept is not limited thereto. For example, unselected word lines may be divided into a plurality of groups, and different read pass voltages may be applied to at least two of grouped word lines.

Figure 13:
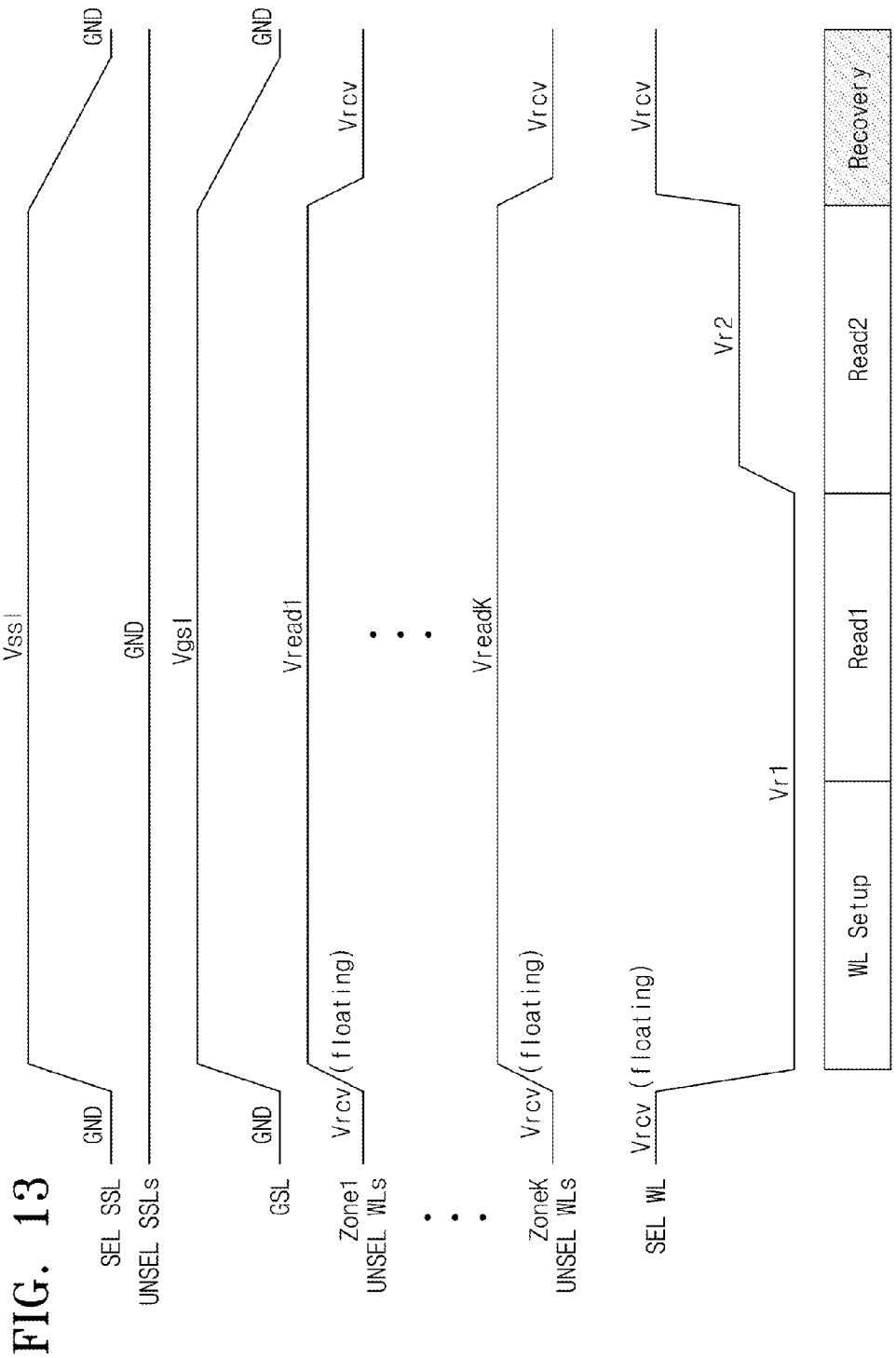
FIG. 13 is a timing diagram of a read operation of a 2-bit memory cell, according to an embodiment of the inventive concept.

FIG. 13 is a timing diagram of a read operation about a 2-bit memory cell, according to an embodiment of the inventive concept. Referring to FIGS. 1 to 11 and 13, unselected word lines are divided into a plurality of zones Zone1 to ZoneK (K being an integer of 2 or more), and read pass voltages Vread1 to VreadK are applied to the plurality of zones Zone1 to ZoneK, respectively. In exemplary embodiments, at least two of the read pass voltages Vread1 to VreadK may be different from each other. Meanwhile, the read pass voltages Vread1 to VreadK may be discharged sequentially in a predetermined direction.

Figure 14:
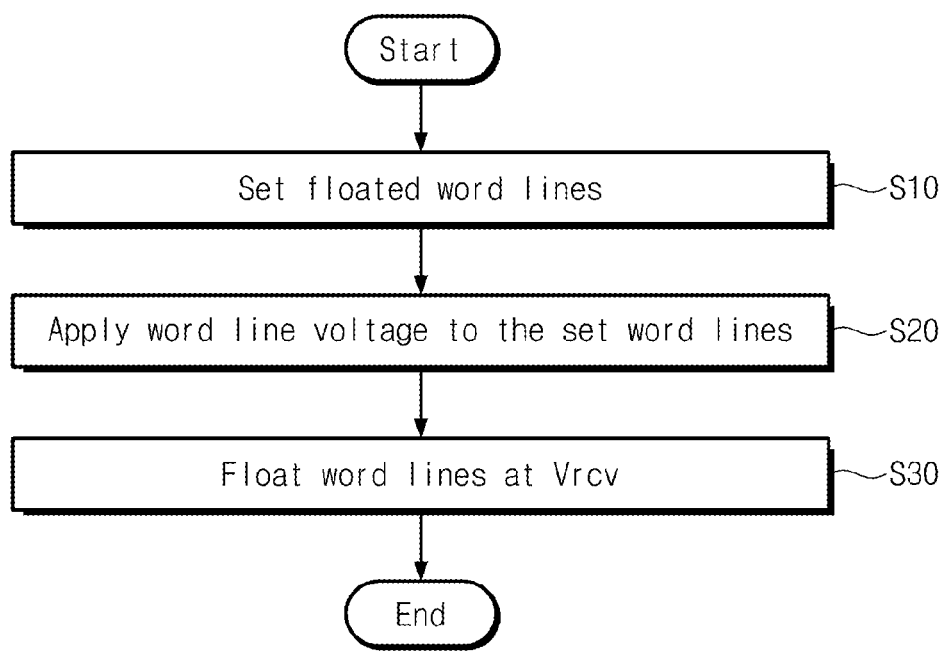
FIG. 14 is a flow chart showing an operation method of a nonvolatile memory device according to an embodiment of the inventive concept.

FIG. 14 is a flow chart showing an operation method of a nonvolatile memory device according to an embodiment of the inventive concept. Referring to FIG. 14, in step S10, floated word lines are set. The word lines may have been floated before an operation command is received from an external device. For example, after being set to a recovery voltage Vrcv, the word lines may be floated. In case a program operation is requested, the floated word lines may be set to a program pass voltage. In case a read operation is requested, a floated selection word line and floated non-selection word lines may be set to a read pass voltage and a word line setup voltage Vset, respectively. In case an erase operation is requested, the floated word lines may be set to a ground voltage. Afterward, in step S20, the word lines thus set are supplied with word line voltages (program voltages, program-verification voltages, read voltages, read-verification voltages, erase voltages, or erase-verification voltages) for the requested operation. In step S30, the word lines may be set to a recovery voltage Vrcv and may then be floated.

With the operation method of the inventive concept, a requested operation may commence, with word lines floated. After the requested operation is ended, the word lines are set to the recovery voltage Vrcv and may then be floated.

Figure 15:
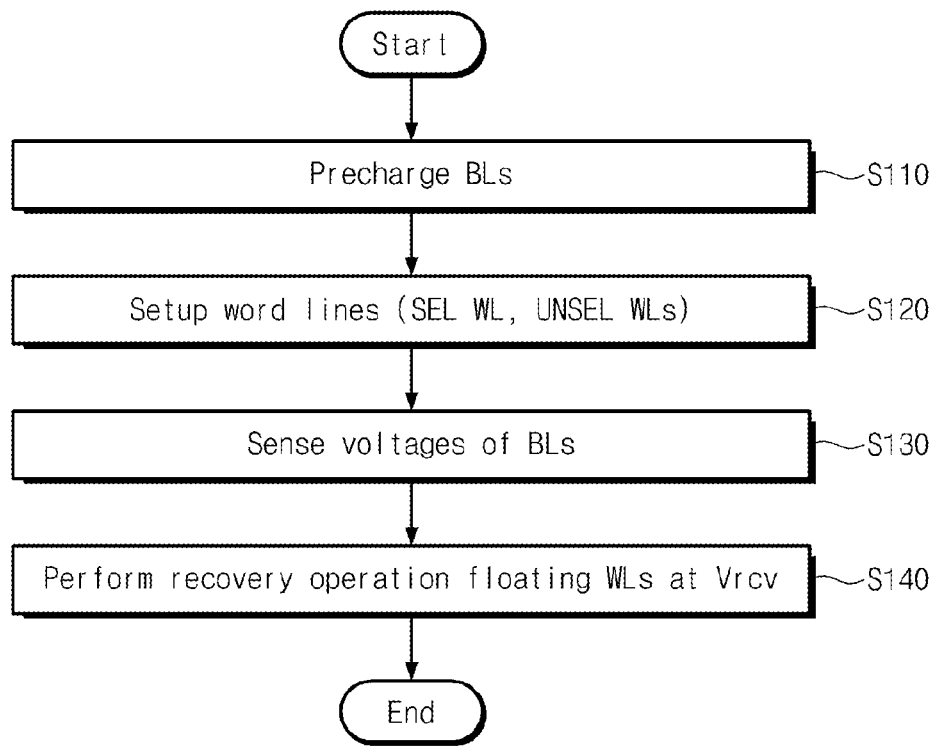
FIG. 15 is a flow chart schematically illustrating a read method of a nonvolatile memory device according to an embodiment of the inventive concept.

FIG. 15 is a flow chart schematically illustrating a read method of a nonvolatile memory device according to an embodiment of the inventive concept. In step S110, all bit lines are pre-charged to perform a read operation. In step S120, a read voltage Vr is applied to a selected word line that has been floated, and a read pass voltage Vread is applied to unselected word lines that have been floated. In step S130, there are sensed voltages at the bit lines during a predetermined time. Afterwards, in step S140, there is performed a recovery operation in which voltages of string/ground selection lines are discharged to a ground voltage GND and the word lines (selected and unselected word lines) are set to a recovery voltage Vrcv higher than 0 V and then floated.

With the read method of the inventive concept, read disturbance may be prevented by discharging word lines to the recovery voltage Vrcv after a sensing operation.

Figure 16:
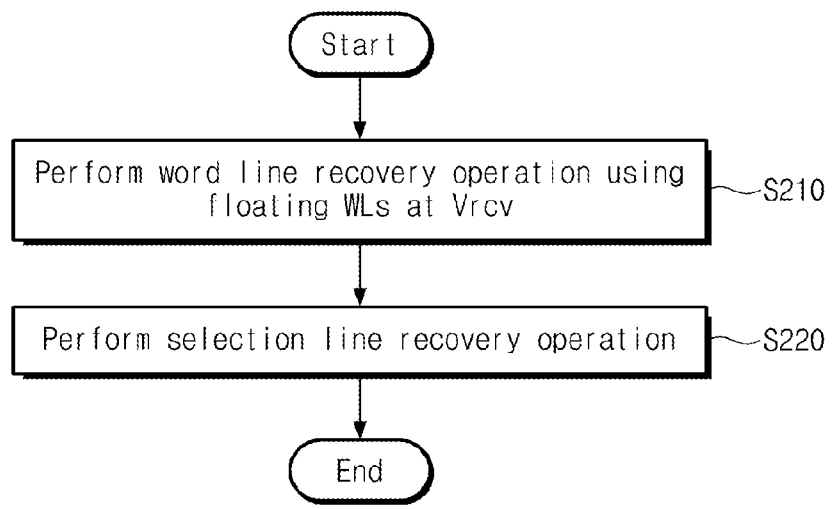
FIG. 16 is a flow chart schematically illustrating a recovery method of a nonvolatile memory device according to an embodiment of the inventive concept.

FIG. 16 is a flow chart schematically illustrating a recovery method of a nonvolatile memory device according to an embodiment of the inventive concept. Referring to FIGS. 1 to 13 and 16, in step S210, after a sensing operation is performed, there is performed a word line recovery operation in which word lines are set to a recovery voltage Vrcv and then floated. In step S220, after the sensing operation is performed, there is performed a selection line recovery operation in which string/ground selection lines are discharged to a ground voltage GND. The above-described recovery operation is applicable to a verification-read operation of a program operation or a read operation.

That is, a recovery method of a nonvolatile memory device which includes a plurality of memory blocks each having a plurality of strings connected between bit lines and a common source line, the strings including pillars penetrating at least one ground selection line, a plurality of word lines, and at least one string selection line stacked in a direction perpendicular to a substrate, may include: performing a first recovery operation in which word lines are discharged to a first voltage Vrcv; and performing a second recovery operation in which at least one string selection line SSL and at least one ground selection line GSL are discharged to a second voltage GND different from the first voltage Vrcv.

With a read operation described with reference to FIGS. 7 to 16, word lines are set to a recovery voltage Vrcv and then are floated. However, the inventive concept is not limited thereto. For example, the read method may be modified or changed in such a way that word lines are floated after a read operation and then discharged to a ground voltage GND.

Figure 17:
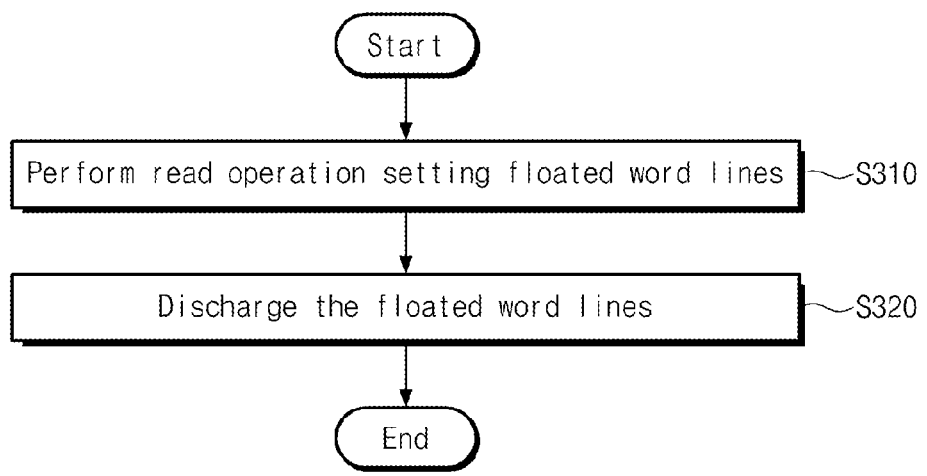
FIG. 17 is a flow chart of a read method of a nonvolatile memory device according to another embodiment of the inventive concept.

FIG. 17 is a flow chart of a read method of a nonvolatile memory device according to another embodiment of the inventive concept. Referring to FIG. 17, in step S310, there is performed a read operation in which word lines are set from floated word lines. In exemplary embodiments, word lines with a recovery voltage Vrcv may be floated in a recovery period of a read operation. In step S320, the floated word lines are discharged to a ground voltage GND based on an external request or a need of a nonvolatile memory device 100.

Figure 18:
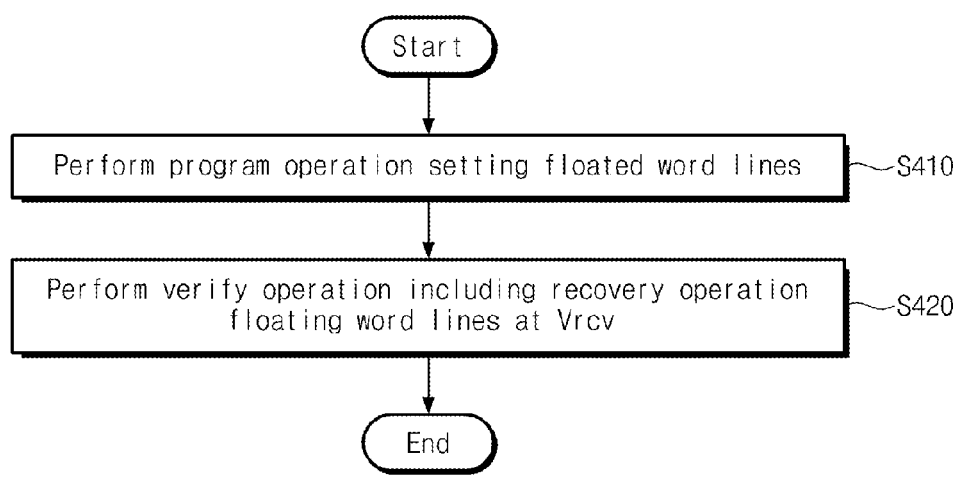
FIG. 18 is a flow chart of a program method of a nonvolatile memory device according to an embodiment of the inventive concept.

A read operation has been described with reference to FIGS. 7 to 17. The inventive concept is applicable to a program operation as well as a read operation. FIG. 18 is a flow chart of a program method of a nonvolatile memory device 100 according to an embodiment of the inventive concept. Now will be described a program method with reference to FIGS. 1 to 18. In step S410, there is performed a program operation setting word lines from floated word lines to store data in memory cells. At this time, word lines with a recovery voltage Vrcv may be floated in a recovery period of the program operation. In step S420, there is performed a verification operation of setting a word line from floated word lines. At this time, word lines with the recovery voltage Vrcv may be floated in a recovery period of the program operation.

Figure 19:
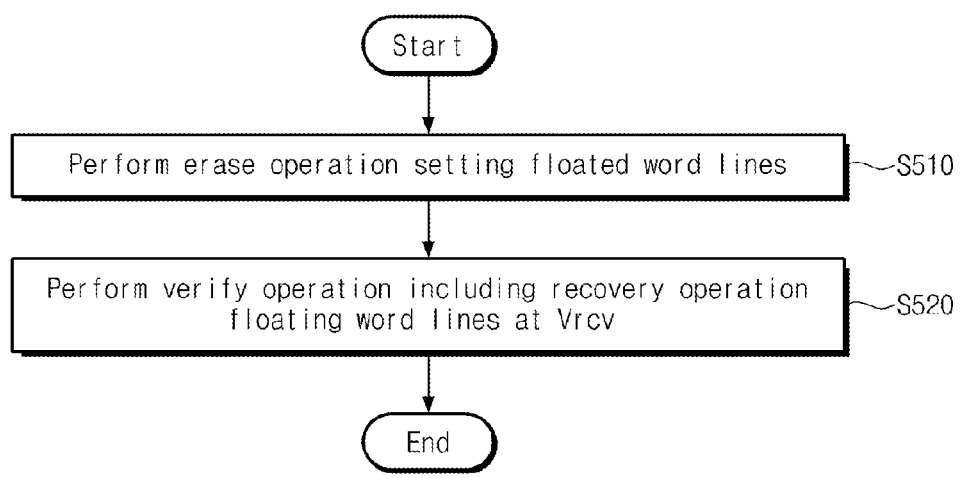
FIG. 19 is a flow chart of an erase method of a nonvolatile memory device according to an embodiment of the inventive concept.

Furthermore, the inventive concept is applicable to an erase operation. FIG. 19 is a flow chart of an erase method of a nonvolatile memory device 100 according to an embodiment of the inventive concept. Now will be described a program method with reference to FIGS. 1 to 19. In step S510, there is performed an erase operation setting word lines from floated word lines to erase a memory block. During the erase operation, an erase voltage is applied to word lines. In step S520, there is performed a verification operation to determine whether the erase operation is normally performed. At this time, word lines with a recovery voltage Vrcv may be floated in a recovery period of the erase operation.

Figure 20:
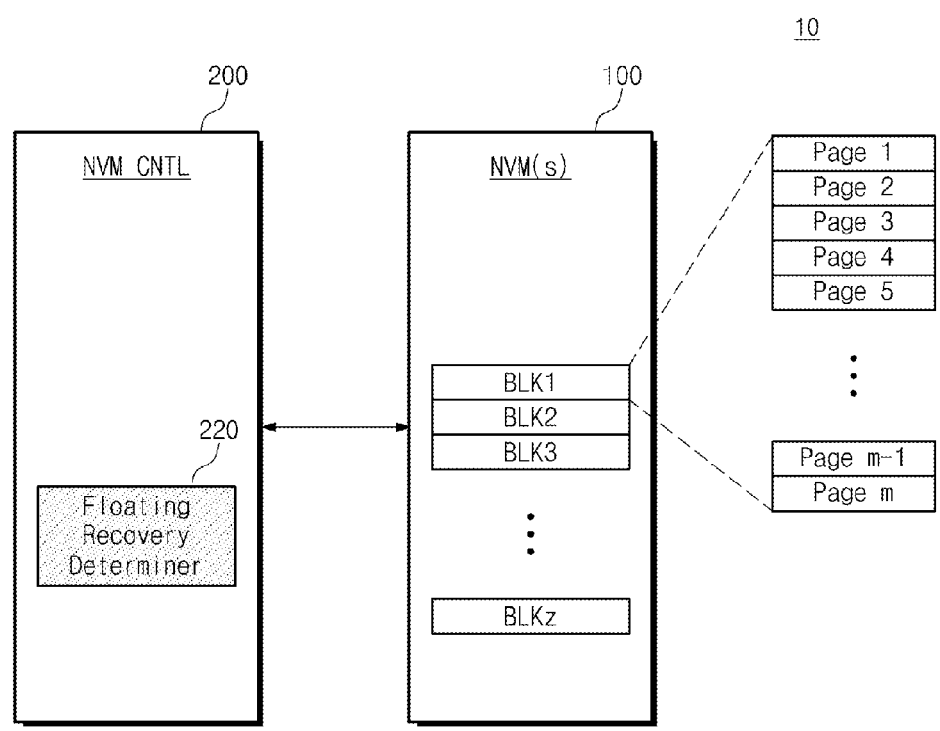
FIG. 20 is a block diagram schematically illustrating a storage device according to an embodiment of the inventive concept.

FIG. 20 is a block diagram schematically illustrating a storage device 10 according to an embodiment of the inventive concept. Referring to FIG. 20, a storage device 10 contains at least one nonvolatile memory device 100 and a memory controller 200 to control the nonvolatile memory device 100. In exemplary embodiments, when a high-speed operation mode is required, the memory controller 200 may control the nonvolatile memory device 100 so as to operate under a condition in which word lines are floated.

In exemplary embodiments, the memory controller 200 determines whether to reduce read disturbance according to environment information or a user's request and provides immunity disturbance read mode information IDRMI to the nonvolatile memory device 100 according to a determination result. In response to the immunity disturbance read mode information IDRMI, the nonvolatile memory device 100 performs a recovery operation for reducing/preventing read disturbance as described with reference to FIGS. 1 to 19.

The memory controller 200 of the inventive concept contains a floating recovery determiner 220. The floating recovery determiner 220 determines whether to operate in a high-speed mode or reduce read disturbance at a program/read/erase operation. Based on the determination result, the floating recovery determiner 220 controls the nonvolatile memory device 100 in such a way that there is performed a recovery operation in which word lines are floated at a recovery voltage Vrcv.

In exemplary embodiments, the storage device 10 may perform a recovery operation according to an external request (or, host request) and an internal request in such a way that word lines are floated with the recovery voltage Vrcv. The storage device 10 according to an embodiment of the inventive concept may improve immunity against read disturbance and perform a program/read/erase operation at high speed.

In FIGS. 1 to 20, the inventive concept has been described as being used in VNAND. However, the inventive concept is not limited thereto. The inventive concept is applicable to a nonvolatile memory device that includes a memory cell (in other words, floating body cell) with an SOI (silicon on insulator) body causing negative boosting at a recovery operation as described with reference to FIG. 6. In particular, the inventive concept is applicable to a shared bit line structure in which strings are formed on an SOI substrate.

Figure 21:
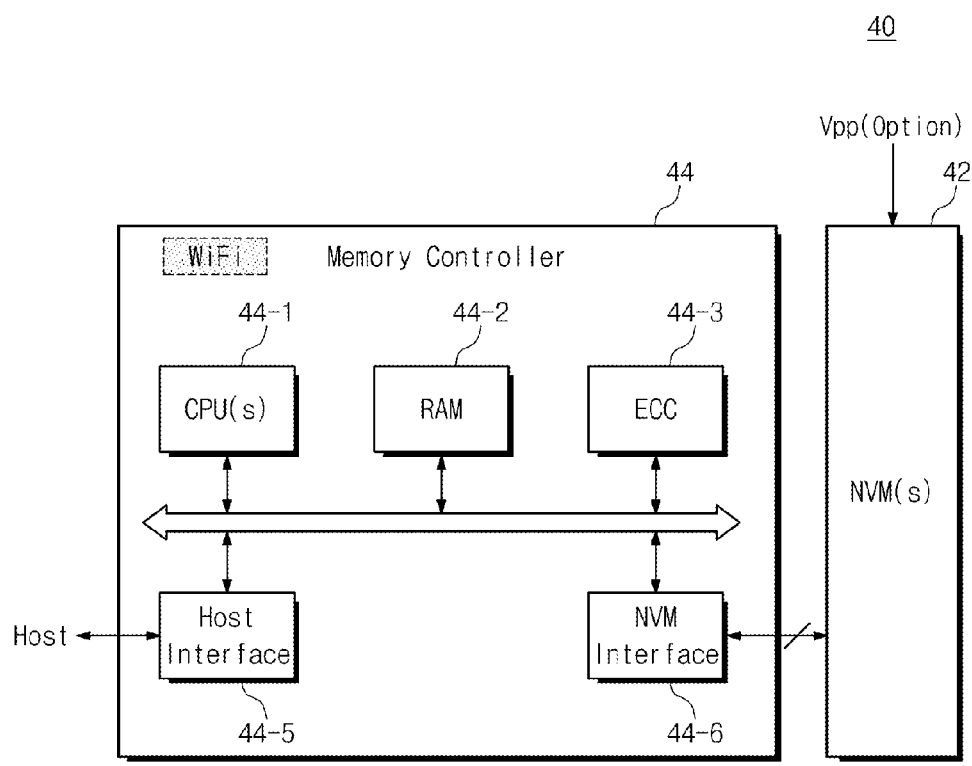
FIG. 21 is a block diagram schematically illustrating a storage device according to an embodiment of the inventive concept.

FIG. 21 is a block diagram schematically illustrating a storage device 40 according to an embodiment of the inventive concept. Referring to FIG. 21, a storage device 40 contains at least one nonvolatile memory device 42 and a memory controller 44 to control the nonvolatile memory device 42. The storage device 40 shown in FIG. 21 may be used as, but not limited to, a storage medium of a memory card (e.g., CF, SD, micro SD, and so on) or an USB storage device.

The nonvolatile memory device 42 may be implemented with a nonvolatile memory device shown in FIG. 1. The memory controller 44 may be implemented with a memory controller 200 shown in FIG. 20. The memory controller 44 may perform an operation of reinforcing immunity against read disturbance based on at least one of environment information such as the number of program loops, an operation mode, pass/fail information about a specific program state, status information, temperature information, the number of P/E (program/erase) cycles, information about an operation-related collection level, information about a physical structure of a word line, information about a physical location of a word line, location information, address information, selection/non-selection information, time information, and so on.

The memory controller 44 controls read, write, and erase operations of the nonvolatile memory device 42 in response to a host request. The memory controller 44 contains at least one central processing unit 44-1, a buffer memory 44-2, an ECC block 44-3, a host interface 44-5, and an NVM interface 44-6.

The central processing unit 44-1 controls an overall operation of the nonvolatile memory device 42 including writing, reading, management of a file system, management of bad pages, and so on. The RAM 44-2 operates in response to a control of the central processing unit 44-1 and is used as a work memory, a buffer memory, and a cache memory. If the RAM 44-2 is used as a work memory, data processed by the central processing unit 44-1 is temporarily stored therein. If used as a buffer memory, the RAM 44-2 is used to buffer data that is transferred from a host to the nonvolatile memory device 42 or from the nonvolatile memory device 42 to the host. As a cache memory, the RAM 44-2 may enable a low-speed nonvolatile memory device 42 to operate at high speed.

The ECC block 44-3 generates an error correction code ECC for correcting a fail bit or an error bit of data received from the nonvolatile memory device 42. The ECC block 44-3 performs error correction encoding on data to be provided to the nonvolatile memory device 42, so a parity bit is added thereto. The parity bit may be stored in the nonvolatile memory device 42. The ECC block 44-3 performs error correction decoding on data output from the nonvolatile memory device 42. The ECC block 44-3 corrects an error using the parity. The ECC block 44-3 corrects an error using LDPC (Low Density Parity Check) code, BCH code, turbo code, RS (Reed-Solomon) code, convolution code, RSC (Recursive Systematic Code), TCM (Trellis-Coded Modulation), BCM (Block Coded Modulation), and so on.

The memory controller 44 exchanges data with the host through the host interface 44-5 and with the nonvolatile memory device 42 through the NVM interface 44-6. The host interface 44-5 may be connected with a host via PATA (Parallel AT Attachment bus), SATA (Serial AT attachment bus), SCSI, USB, PCIe, NAND interface, and so on.

In exemplary embodiments, the memory controller 44 may contain a RF communication function (e.g., WiFi). In exemplary embodiments, the nonvolatile memory device 42 may be supplied with a high voltage Vpp, optionally.

The storage device 40 according to an embodiment of the inventive concept may prevent read disturbance by floating word lines at a predetermined voltage during a recovery operation. Also, the storage device 40 may support an operation in which a requested access commences with word lines having a voltage (e.g., higher than 0 V) floated, thereby making it possible to reduce power consumption and a time taken to perform the requested access.

Figure 22:
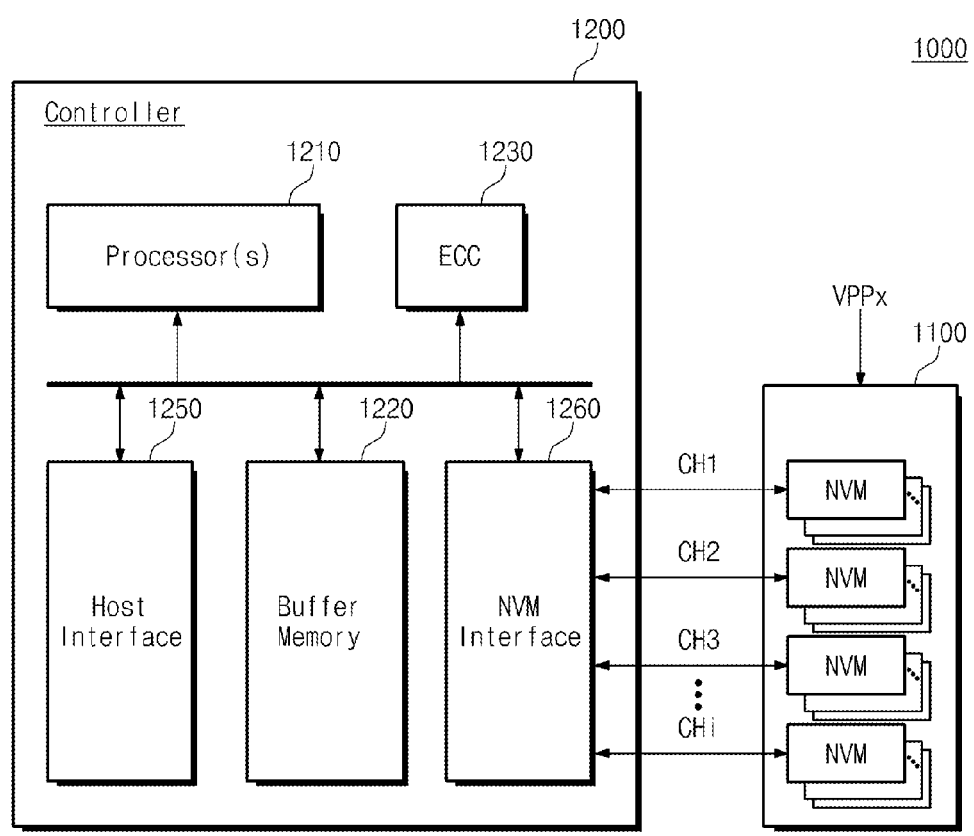
FIG. 22 is a block diagram schematically illustrating a solid state drive according to an embodiment of the inventive concept.

The inventive concept is applicable to a solid state drive (SSD). FIG. 22 is a block diagram schematically illustrating a solid state drive according to an embodiment of the inventive concept. Referring to FIG. 22, a solid state drive (hereinafter, referred to as SSD) 1000 includes a plurality of nonvolatile memory devices 1100 and an SSD controller 1200.

The nonvolatile memory devices 1100 are implemented to be provided with an external high voltage VPPx optionally. The SSD controller 1200 is connected to the nonvolatile memory devices 1100 through a plurality of channels CH1 to CHi (i being an integer of 2 or more). The SSD controller 1200 may be implemented with a memory controller 200 described with reference to FIG. 20. The SSD controller 1200 includes one or more processors 1210, a buffer memory 1220, an ECC block 1230, a host interface 1250, and a nonvolatile memory interface 1260.

The buffer memory 1220 temporarily stores data needed to drive the SSD controller 1200. In exemplary embodiments, the buffer memory 1220 may include a plurality of memory lines each of which stores data or a command. The memory lines may be mapped onto cache lines via various methods. The ECC block 1230 is configured to calculate an ECC value of data to be programmed at a write operation, correct an error of read data according to an ECC value at a read operation, and correct an error of data restored from the nonvolatile memory device 1100 at a data restoration operation. Although not shown in FIG. 22, a code memory may be further provided to store code data needed to drive the SSD controller 1200. The code memory may be implemented with a nonvolatile memory device.

The host interface 1250 provides an interface with an external device. The host interface 1250 may be a NAND flash interface. Besides, the host interface 1250 may be implemented with various interfaces or with a plurality of interfaces. The nonvolatile memory interface 1260 provides an interface with the nonvolatile memory devices 1100. The SSD 1000 according to an embodiment of the inventive concept may prevent read disturbance at a program/read/erase operation, thereby improving its performance markedly.

Figure 23:
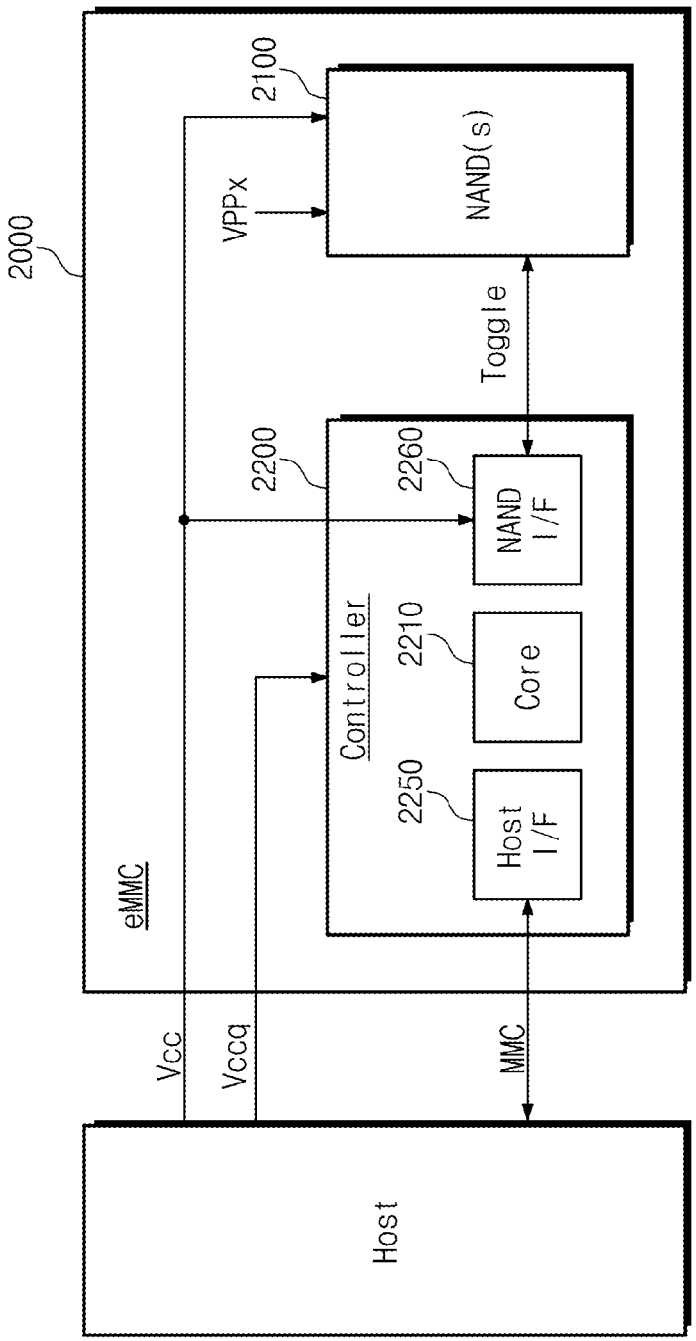
FIG. 23 is a block diagram schematically illustrating an eMMC according to an embodiment of the inventive concept.

The inventive concept is applicable to an eMMC (e.g., an embedded multimedia card, moviNAND, iNAND, etc.). FIG. 23 is a block diagram schematically illustrating an eMMC according to an embodiment of the inventive concept. Referring to FIG. 23, an eMMC 2000 includes one or more NAND flash memory devices 2100 and a controller 2200.

The NAND flash memory devices 2100 may be implemented with a nonvolatile memory device 100 described with reference to FIG. 1. The controller 2200 is connected to the NAND flash memory device 2100 via a plurality of channels. The controller 2200 may be implemented with a memory controller 200 described with reference to FIG. 20. The controller 2200 contains one or more controller cores 2210, a host interface 2250, and a NAND interface 2260. The controller core 2210 may control an overall operation of the eMMC 2000. The host interface 2250 is configured to interface between the controller 2200 and a host. The NAND interface 2260 is configured to interface between the NAND flash memory device 2100 and the controller 2200. In exemplary embodiments, the host interface 2250 may be a parallel interface (e.g., MMC interface). In other exemplary embodiments, the host interface 2250 of the eMMC 2000 may be a serial interface (e.g., UHS-II, UFS interface, and so on). Alternatively, the host interface 2250 of the eMMC 2000 may be a NAND interface.

The eMMC 2000 receives power supply voltages Vcc and Vccq from the host. Here, the power supply voltage Vcc (e.g., about 3.3 V) may be supplied to the NAND flash memory device 2100 and the NAND interface 2260, and the power supply voltage Vccq (e.g., about 1.8 V/3.3 V) may be supplied to the controller 2200. In exemplary embodiments, the eMMC 2000 may be optionally supplied with an external high voltage.

The eMMC 2000 according to an embodiment of the inventive concept may support an operation in which a requested access (e.g., read, program, or erase operation) commences with word lines having a voltage (e.g., higher than 0 V) floated, thereby making it possible to reduce a time taken to set up voltages.

Figure 24:
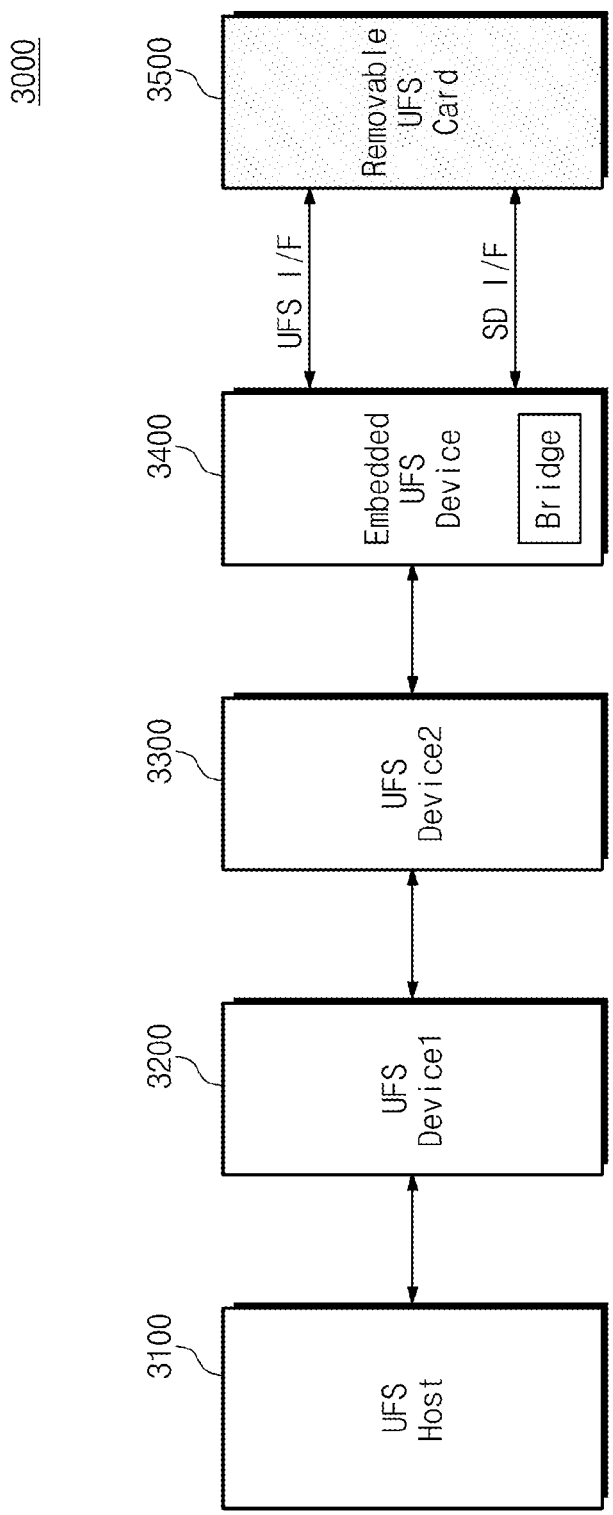
FIG. 24 is a block diagram schematically illustrating a UFS system according to an embodiment of the inventive concept.

The inventive concept is applicable to Universal Flash Storage UFS. FIG. 24 is a block diagram schematically illustrating a UFS system according to an embodiment of the inventive concept. Referring to FIG. 24, a UFS system 3000 includes a UFS host 3100, UFS devices 3200 and 3300, an embedded UFS device 3400, and a removable UFS card 3500. The UFS host 3100 may be an application processor of a mobile device. Each of the UFS host 3100, the UFS devices 3200 and 3300, the embedded UFS device 3400, and the removable UFS card 3500 may communicate with external devices through the UFS protocol. At least one of the UFS devices 3200 and 3300, the embedded UFS device 3400, and the removable UFS card 3500 may be implemented with a storage device 10 shown in FIG. 20.

Meanwhile, the embedded UFS device 3400 and the removable UFS card 3500 may contain a bridge that communicates using protocols different from the UFS protocol. The UFS host 3100 and the removable UFS card 3500 may communicate through various card protocols (e.g., UFDs, MMC, SD (secure digital), mini SD, Micro SD, and so on).

Figure 25:
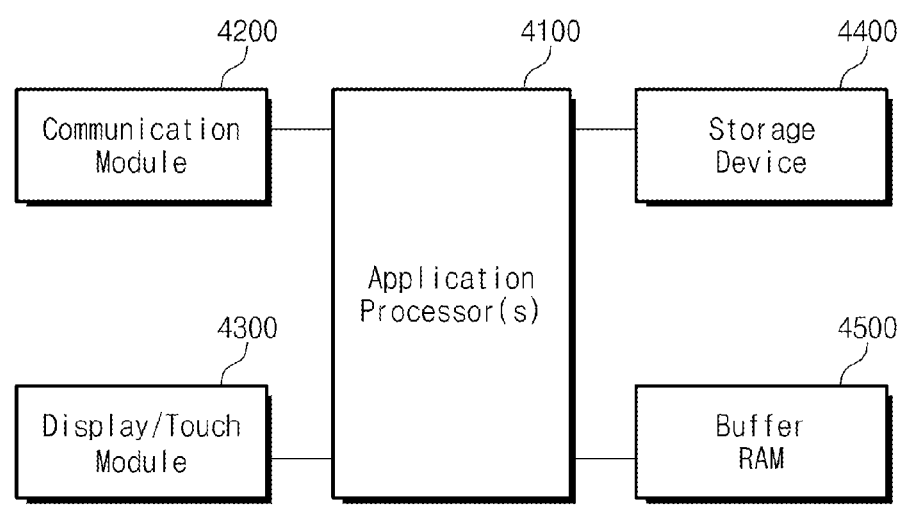
FIG. 25 is a block diagram schematically illustrating a mobile device according to an embodiment of the inventive concept.

The inventive concept is applicable to a mobile device. FIG. 25 is a block diagram schematically illustrating a mobile device 4000 according to an embodiment of the inventive concept. Referring to FIG. 25, a mobile device 4000 includes an application processor 4100, a communication module 4200, a display/touch module 4300, a storage device 4400, and a mobile RAM 4500.

The application processor 4100 controls an overall operation of the mobile device 4000. The communication module 4200 is configured to perform wireless or wire communications with an external device. The display/touch module 4300 is configured to display data processed by the application processor 4100 or to receive data through a touch panel. The storage device 4400 is configured to store user data. The storage device 4400 may be, but not limited to, a memory card, an eMMC, an SSD, or an UFS device. The storage device 4400 is configured to perform a recovery operation in which after a sensing operation (including verification-read operations at a read operation, a program operation, an erase operation, and so on), word lines are set up with a predetermined voltage (e.g., higher than 0 V) via discharging and/or charging operations. The mobile RAM 4500 is configured to temporarily store data necessary when the mobile device 4000 operates.

The mobile device 4000 according to an embodiment of the inventive concept may support an operation in which a requested access (e.g., read, program, or erase operation) commences with word lines having a voltage (e.g., higher than 0 V) floated or may terminate a recovery operation, in which word lines are set up with a predetermined voltage and then floated, to prevent a channel-off range from being generated in a string channel. Thus, it is possible to improve the performance of the mobile device 4000.

A memory system and/or a storage device according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of operating a nonvolatile memory device which includes at least one string connected to a bit line, the at least one string including a plurality of memory cells connected in series, each of the plurality of memory cells being connected to a respective word line among a plurality of word lines and stacked in a direction perpendicular to a substrate, the method comprising:
   applying a word line voltage needed for an operation to a first word line among the word lines;
   applying a recovery voltage higher than a ground voltage to the first word line after the operation; and then
   floating the first word line at the recovery voltage.

2. The method of claim 1, further comprising setting up the first word line which is floated at the recovery voltage to a setup voltage before the applying the word line voltage to the first word line.

3. The method of claim 2, wherein the setup voltage is a program pass voltage when the operation is a program operation.

4. The method of claim 2, wherein, when the operation is a read operation and the first word line is a selected word line, the setup voltage is a word line setup voltage, and the method further comprises setting up a second word line which is an unselected word line to a read pass voltage, the read pass voltage is higher than the word line setup voltage.

5. The method of claim 4, wherein the applying the recovery voltage includes applying the recovery voltage to the second word line, and
   wherein the floating the first word line includes floating the second word line at the recovery voltage.

6. The method of claim 4, wherein applying the word line voltage comprises pre-charging the bit line and applying a read voltage to the selected word line to sense a voltage of the bit line.

7. The method of claim 1, wherein the at least one string includes a string selection transistor connected to a string selection line and a ground selection transistor connected to a ground selection line, which are connected in series with the plurality of memory cells; and
   wherein the string selection line and the ground selection line are discharged from a first voltage to a second voltage which is lower than the first voltage during the applying the recovery voltage to the first word line.

8. The method of claim 7, wherein the first voltage is a turn-on voltage and the second voltage is the ground voltage.

9. The method of claim 1, wherein the recovery voltage is a power supply voltage.

10. A method of operating a nonvolatile memory device which includes a first string and a second string connected to a bit line, the first string including a first string selection transistor connected to a first string selection line, the second string including a second string selection transistor connected to a second string selection line, and each of the first string and the second string including a plurality of memory cells connected in series, each of the plurality of memory cells connected to word lines and stacked in a direction perpendicular to a substrate, the method comprising:
   applying at least one word line voltage needed for an operation to the word lines;
   applying at least one recovery voltage higher than a ground voltage to the word lines;
   discharging the first string selection line from a first voltage to a second voltage during the applying the at least one recovery voltage; and
   floating the word lines.

11. The method of claim 10, wherein the first voltage is a turn-on voltage for the first string selection transistor, and the second voltage is the ground voltage.

12. The method of claim 10, wherein the second string selection transistor is maintained with a turn-off voltage.

13. The method of claim 10, wherein the word lines are floated at the at least one recovery voltage.

14. The method of claim 10, further comprising setting up the word lines which are floated at the at least one recovery voltage.

15. The method of claim 14, wherein the setting up the word lines comprises applying a read pass voltage to unselected word lines and a word line setup voltage to a selected word line, and wherein applying at least one word line voltage comprises pre-charging the bit line and applying a read voltage to the selected word line to sense the bit line.

16. A nonvolatile memory device comprising:
   a memory cell array including a plurality of strings connected to a bit line, each of the plurality of strings including a plurality of memory cells connected in series, each of the plurality of memory cells connected to word lines and stacked in a direction perpendicular to a substrate; and
   a control logic configured to apply a word line voltage needed for an operation to a first word line among the word lines, to apply a recovery voltage higher than a ground voltage to the first word line after the operation, and then to float the first word line at the recovery voltage.

17. The nonvolatile memory device of claim 16, wherein the control logic sets up the floated word line by applying a read pass voltage to unselected word lines among the word lines and a word line setup voltage to a selected word line among the word lines.

18. The nonvolatile memory device of claim 16, wherein the control logic performs a read operation by pre-charging the bit line and applying a read voltage to a selected word line among the word lines to sense the bit line.

19. The nonvolatile memory device of claim 16, wherein each of the plurality of strings includes a string selection transistor connected to a string selection line and a ground selection transistor connected to a ground selection line, which are connected in a series with the plurality of memory cells; and
   wherein the string selection line and the ground selection line are discharged to the ground voltage during the applying the recovery voltage.

20. The nonvolatile memory device of claim 16, wherein each of the plurality of strings includes a string selection transistor connected to a string selection line and a ground selection transistor connected to a ground selection line, which are connected in a series with the plurality of memory cell; and wherein the control logic discharges the string selection line and the ground selection line to the ground voltage after the floating the word lines.

21. The nonvolatile memory device of claim 20, wherein the control logic applies a read pass voltage to unselected word lines and a word line setup voltage to a selected word line, and then applies a read voltage to the selected word line.

22. The nonvolatile memory device of claim 16, wherein the plurality of strings includes a selected string selection transistor connected to a selected string selection line and unselected string selection transistors connected to unselected string selection lines; and wherein the unselected string selection transistors are turned-on during a first predetermined time when the word lines are set up.

23. The nonvolatile memory device of claim 22, wherein the unselected string selection transistors are turned-on during a second predetermined time when the word lines are floated at the recovery voltage.

24. The nonvolatile memory device of claim 23, the selected string selection line and the ground selection line are discharged to the ground voltage after the second predetermined time.

25. The nonvolatile memory device of claim 16, wherein the plurality of strings includes memory cells connected to a selected word line, and unselected memory cells connected to unselected word lines; and wherein a first read voltage is applied to the selected word line in a first read period of the read operation, a second read voltage higher than the first read voltage is applied to the selected word line in a second read period of the read operation, and then the selected word line and the unselected word lines are floated at the recovery voltage.

26. The nonvolatile memory device of claim 16, wherein the word lines are divided into a plurality of groups, and different word line voltages are applied to at least two of the plurality of groups.

27. The nonvolatile memory device of claim 16, wherein the floated word lines are discharged according to at least one of an external request and an internal request.

28. A storage device comprising:
a nonvolatile memory device including a plurality of strings connected to a bit line, each of the plurality of strings including a plurality of memory cells connected in a series, each of the plurality of memory cells connected to word lines and stacked in a direction perpendicular to a substrate; and
a memory controller configured to control the nonvolatile memory device,
wherein the nonvolatile memory device is configured to apply a word line voltage needed for an operation to a first word line among the word lines, to apply a recovery voltage higher than a ground voltage to the first word line after the operation, and then to float the first word line at the recovery voltage.

29. The storage device of claim 28, wherein the nonvolatile memory device sets up the floated word lines by applying a read pass voltage to unselected word lines and a word line setup voltage to a selected word line.

* * * * *